(12) United States Patent
Xu et al.

(10) Patent No.: US 10,686,466 B2
(45) Date of Patent: Jun. 16, 2020

(54) SYSTEM AND METHODS FOR DATA COMPRESSION AND NONUNIFORM QUANTIZERS

(71) Applicant: CABLE TELEVISION LABORATORIES, INC., Louisville, CO (US)

(72) Inventors: Mu Xu, Broomfield, CO (US); Zhensheng Jia, Superior, CO (US); Jing Wang, Broomfield, CO (US); Luis Alberto Campos, Superior, CO (US)

(73) Assignee: CABLE TELEVISION LABORATORIES, INC., Louisville, CO (US)

( * ) Notice: Subject to any disclaimer, the term of this patent is extended or adjusted under 35 U.S.C. 154(b) by 0 days.

(21) Appl. No.: 16/503,316

(22) Filed: Jul. 3, 2019

(65) Prior Publication Data
US 2019/0326926 A1  Oct. 24, 2019

Related U.S. Application Data

(63) Continuation-in-part of application No. 16/153,692, filed on Oct. 5, 2018.

(60) Provisional application No. 62/568,679, filed on Oct. 5, 2017, provisional application No. 62/573,780, filed on Oct. 18, 2017, provisional application No. 62/693,704, filed on Jul. 3, 2018.

(51) Int. Cl.
*H03M 3/00* (2006.01)
*H03M 7/36* (2006.01)
*H03M 1/12* (2006.01)
*G06F 17/16* (2006.01)
*H03M 13/00* (2006.01)
*G06F 17/17* (2006.01)
*H03M 1/06* (2006.01)

(52) U.S. Cl.
CPC .......... *H03M 7/3044* (2013.01); *G06F 17/16* (2013.01); *G06F 17/17* (2013.01); *H03M 1/0626* (2013.01); *H03M 1/1265* (2013.01); *H03M 13/6583* (2013.01)

(58) Field of Classification Search
CPC .................. H03M 7/3044; H03M 1/0626
USPC .................. 341/143, 155, 120, 118
See application file for complete search history.

(56) References Cited

U.S. PATENT DOCUMENTS

2007/0043559 A1* 2/2007 Fischer .......... G10L 21/0208
                                                      704/219
2016/0119570 A1* 4/2016 Wong .............. H04N 5/3575
                                                      348/308

\* cited by examiner

*Primary Examiner* — Peguy Jean Pierre
(74) *Attorney, Agent, or Firm* — Lathrop GPM LLP

(57) ABSTRACT

A method for differentiator-based compression of digital data includes (a) using a subtraction module, subtracting a predicted signal from a sample of an original signal to obtain an error signal, (b) using a quantization module, quantizing the error signal to obtain a quantized error signal, and (c) generating the predicted signal using a least means square (LMS)-based filtering method.

17 Claims, 25 Drawing Sheets

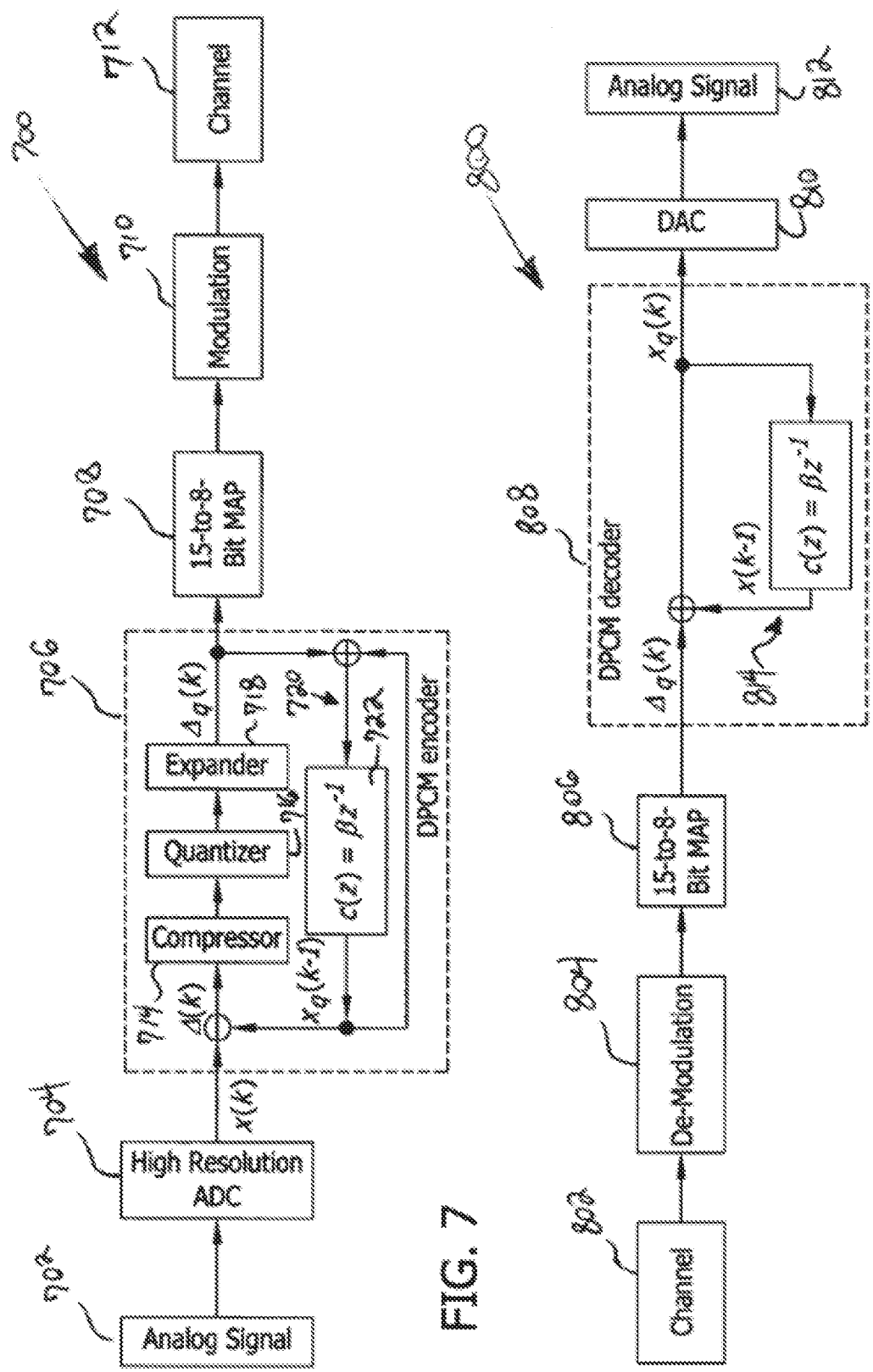

SYSTEM AND METHODS FOR DATA COMPRESSION AND NONUNIFORM QUANTIZERS

CROSS REFERENCE TO RELATED APPLICATIONS

This application is a continuation-in-part of U.S. patent application Ser. No. 16/153,692, filed Oct. 5, 2018, which claims the benefit of and priority to U.S. Provisional Patent Application Ser. No. 62/568,679, filed Oct. 5, 2017, and to U.S. Provisional Patent Application Ser. No. 62/573,780, filed Oct. 18, 2017. This application also claims benefit of and priority to U.S. Provisional Patent Application Ser. No. 62/693,704, filed Jul. 3, 2018. The disclosures of each of these prior applications are incorporated herein by reference in their entireties.

BACKGROUND

The field of the disclosure relates generally to optical communication systems and networks, and more particularly, to data compression, coding, and quantizers for analog and digital optical systems and networks.

Conventional hybrid fiber-coaxial (HFC) architectures deploy long fiber strands from an optical hub to a fiber node, and typically many short fiber strands to cover the shorter distances from the HFC nodes to a plurality of end users. Conventional Multiple Service Operators (MSOs) offer a variety of services, including analog/digital TV, video on demand (VoD), telephony, and high speed data internet, over these HFC networks, which utilize both optical fibers and coaxial cables, and which provide video, voice, and data services to the end user subscribers. The HFC network typically includes a master headend, and the long optical fiber carries the optical signals and connects the link between the headend, the hub, and the fiber node. Conventional HFC networks also typically include a plurality of coaxial cables to connect the fiber nodes to the respective end users, and which also carry radio frequency (RF) modulated analog electrical signals.

The HFC fiber node converts optical analog signals from the optical fiber into the RF modulated electrical signals that are transported by the coaxial cables to the end users/subscribers. Some HFC networks implement a fiber deep architecture, and may further utilize electrical amplifiers disposed along the coaxial cables to amplify the RF analog signals. In the conventional HFC network, both the optical and electrical signals are in the analog form, from the hub all the way to the end user subscriber's home. Typically, a modem termination system (MTS) is located at either the headend or the hub, and provides complementary functionality to a modem of the respective end user.

The continuous growth of optical intra/inter-data-center link, 5G mobile fronthaul (MFH) and backhaul (MBH), next-generation distributed HFC architectures and access networks, passive optical networks (PONs), and high-speed optical short-reach transmission systems with advanced multi-level modulation formats require an equivalent growth in the development of advanced digital multi-level modulation formats to process the vastly increased amount of data transmitted over the various networks. Presently, conventional deployments of 1G/10G PON systems using nonreturn to zero (NRZ) modulation are unable to meet the growing capacity demand to deliver future high-speed data and video services.

The growth of the optical link and network architectures has been matched, and in many ways outpaced, by a continuously-growing demand on high-speed Internet, high-definition TV, and real-time entertainment services, which has created an additional challenge for future broadband access networks. These emerging new services, which include virtual reality and 5G, are rapidly depleting the bandwidth resources of existing PONs, MFH, and HFC networks, where upgrades to system capacity and spectral efficiency is urgently needed.

Some conventional communication networks operate according to DOCSIS 3.1 specifications, which are standardized, and feature orthogonal frequency-division multiplexing (OFDM) and higher order of modulations (>4096 QAM). However, although the DOCSIS specification provides higher flexibility and spectral efficiency, it also presents new technical issues and challenges. For example, the demanding carrier-to-noise ratio (CNR) specified by DOCSIS 3.1 specifications for high order modulations cannot not be supported by legacy digital-to-analog (D/A) or analog-to-digital (A/D) converters having resolutions and the range of 8-10 digits. Replacement of every legacy D/A or A/D converter at the customer premises of a user would incur a substantially high cost, and therefore there is a need in the field new algorithms that are capable of suppressing quantization noise without the McKinley impairing D/A and A/D performances. Additionally, the continuous envelope and high peak-to-average power ratio (PAPR) of OFDM signals render the signals vulnerable to nonlinear distortions in analog HFC networks.

Recent progress in advanced A/D and D/A quantizers and data compression techniques for transmitting OFDM signals is encouraging improvement to the transmission techniques for digital RFoG (D-RFoG) systems. Some quantizer or compression techniques utilize partial bit sampling (PBS), but results in rapid increases to the quantization noise when reducing the number of digits. Fitting based nonlinear quantization (FBNQ) operations are recommended by the standard of Open Radio Equipment Interface (ORI). However, the FBNQ algorithm is complex and time consuming because it needs to estimate the statistical characteristics from a large number of samples, which increases the system delay. Moreover, the accuracy of FBNQ seriously degrades when quantizing the amplitudes distributed outside the inter-quartile range (IQR). Some matured companding methods, including μ-law and A-law, for encoding acoustic signals have been used in tuning the quantization levels. However, the logarithmic compression function of these methods is not optimal to suppress the quantization noise of Gaussian distributed OFDM signals. Accordingly, new algorithms are needed for optimizing the non-uniformly distributed quantization levels.

The growing performance requirements of 5G new-radio (NR), high-speed Internet access, and high-resolution multimedia entertainment with virtual reality create even further challenges to future fiber-wireless integrated MFH. Recent 5G-NR specifications feature OFDM and higher order modulations (e.g., 256- and 1024-QAM). However, proposals to integrate these two technologies have resulted in new difficulties, such as high sensitivity to nonlinear distortions and increased requirements on high-resolution D/A converters, which limit the quality and transmission distance of analog radio-over-fiber (A-RoF) optical networks in MFH. However, digital RoF (D-RoF) networks have demonstrated greater compatibility with different formats, as well as greater suitability for the 5G-NR environment that includes a more diverse spectrum and services. D-RoF also utilizes high immunity to nonlinear distortions, and better capability for error-free transmissions through use of forward error coding/correction (FEC) techniques. Furthermore, by the additional use of data compression and advanced modulation formats, D-RoF is better able to mitigate bandwidth and efficiency, and better digitally transport high-quality wireless signals between the baseband unit pool (BBU-pool) and radio access units (RAU) with increased transmission distance and improved power budgets. Accordingly, the results would need to develop algorithms to improve the compression efficiency of D-RoF MFH for 5G-NR specifications.

BRIEF SUMMARY

In an embodiment, an optical network includes a transmitting portion configured to (i) encode an input digitized sequence of data samples into a quantized sequence of data samples having a first number of digits per sample, (ii) map the quantized sequence of data samples into a compressed sequence of data samples having a second number of digits per sample, the second number being lower than the first number, and (iii) modulate the compressed sequence of data samples and transmit the modulated sequence over a digital optical link. The optical network further includes a receiving portion configured to (i) receive and demodulate the modulated sequence from the digital optical link, (ii) map the demodulated sequence from the second number of digits per sample into a decompressed sequence having the first number of digits per sample, and (iii) decode the decompressed sequence.

In an embodiment, an analog-to-digital converter includes a sampling unit configured to sample an analog voltage signal into a sequence of discrete samples, a non-uniform quantizing unit configured to quantize the discrete digital samples with 2x quantization levels, where x represents a first number of digits per sample. The analog-to-digital converter further includes a mapping unit configured to map the quantized discrete digital samples from the first number of digits per sample into a second number of digits per sample, wherein the second number is greater than the first number.

In an embodiment, a data compression method is provided for an input digital sequence of discrete signal samples having an input number of digits per sample. The method includes steps of applying a companding function to the input signal samples according to the input number of digits per sample, calculating a companded output number of digits per sample that is less than the input number of digits per sample, quantizing the input signal samples according to the companded output number of digits per sample, and outputting a digital sequence of signal samples having the companded output number of digits per sample.

In an embodiment, a method for differential-based compression of digital data includes (a) using a subtraction module, subtracting a predicted signal from a sample of an original signal to obtain an error signal, (b) using a quantization module, quantizing the error signal to obtain a quantized error signal, and (c) generating the predicted signal using a least means square (LMS)-based filtering method.

In an embodiment, a method for differential-based decompression includes (a) using an addition module, adding a predicted signal to a quantized error signal to obtain a quantized original signal, and (b) generating the predicted signal using a least means square (LMS)-based filtering method.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIG. 7 is a schematic illustration of a digital transmitter, according to an embodiment.

FIG. 8 is a schematic illustration of a digital receiver, according to an embodiment.

Figure 1:
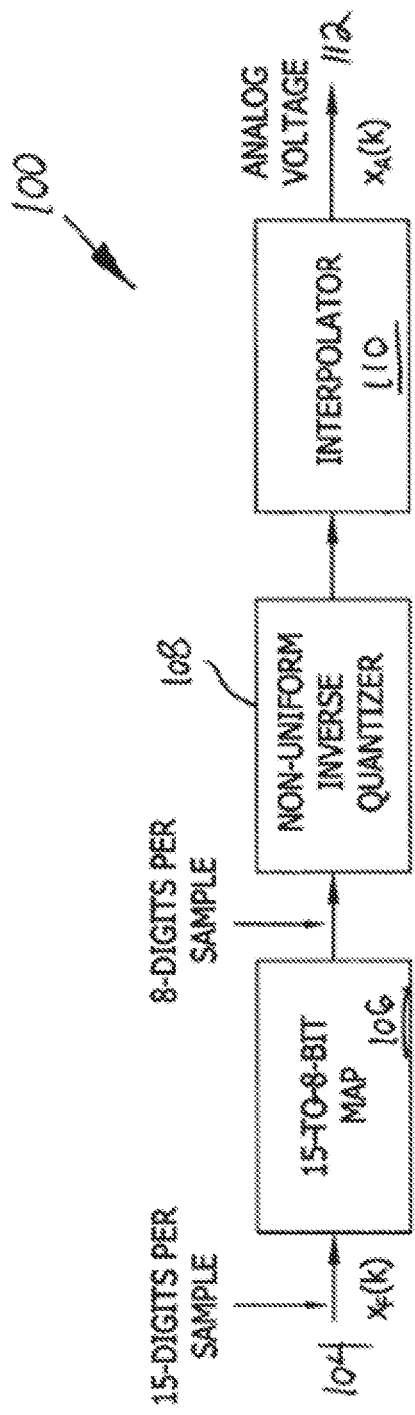
FIG. 1A is a schematic illustration of a non-uniform digital-to-analog converter, according to an embodiment.
FIG. 1B is a schematic illustration of a non-uniform analog-to-digital converter, according to an embodiment.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the embodiments described herein, memory may include, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Furthermore, as used herein, the term "real-time" refers to at least one of the time of occurrence of the associated events, the time of measurement and collection of predetermined data, the time for a computing device (e.g., a processor) to process the data, and the time of a system response to the events and the environment. In the embodiments described herein, these activities and events occur substantially instantaneously.

According to the embodiments described herein, digitization transmission scheme may advantageously transmit digitized radio signals through the optical fiber link and convert the signal back into analog format at remote fiber nodes. This digitized radio transmission scheme is further useful for utilization in MFH networks using a common public radio interface (CPRI). The transmission scheme implements a sufficient number of quantization digits and FEC, such that digitized radio carriers may be reconstructed by a D/A converter with no quality degradation. Additionally, the digital compression algorithm techniques described herein enable further reduction of the number of digits, and with a suppressed quantization noise floor. According to these advantageous systems and methods, the transmission efficiency (TE, defined as the ratio between the effective bandwidths of the encapsulated analog signals and the converted digital signals) of the network is substantially improved.

Non-Uniform Quantizers for Analog and Digital Systems

The following embodiments describe algorithms for optimizing non-uniformly distributed quantization levels, and to resolve the challenges arising from use of PBS, FBNQ, and the logarithmic compression function of companding levels. A first such algorithm is based on the K-parameter fast statistical estimation (FSE), also referred to as K-law. This algorithm embodiment proves to be computationally efficient, and particularly useful for OFDM signals with Gaussian distributed amplitudes. A second algorithm is based on the relaxed Lloyd algorithm (R-Lloyd), and is useful for determining the decision threshold and quantization levels based on minimum square error criteria. This R-Lloyd-based technique (i) is compatible with multiple formats, (ii) is not limited to Gaussian distributions, and (iii) exhibits lower quantization noise level with fewer digits (sometimes though, at the expense of increased computing complexity).

FIG. 1A is a schematic illustration of a non-uniform D/A converter 100. FIG. 1B is a schematic illustration of a non-uniform A/D converter 102. Converters 100, 102 may be implemented as one or more discrete hardware components, as a system of individual software modules, or as a combination thereof. In an exemplary embodiment, D/A converter 100 includes and input signal 104, or $x_F(k)$. Input signal 104 may, for example, represent a digital signal sampled at 15 digits per sample. Input signal 104 is fed into a map 106. In the example illustrated in FIG. 1, map 106 is a 15-to-8-bit map, which then outputs 8 digits per sample to a non-uniform inverse quantizer 108. That is, the data samples with 15-digits per sample are mapped to 8-digits per sample. Inverse quantizer 108 converts the 8-digit samples into voltage levels and sends the inverse-quantized signal to an interpolator 110, which determines the amplitude of the voltage pulses input from inverse quantizer 108, and then outputs an analog voltage 112, or $x_A(k)$. In some embodiments, the 15-to-8-digits mapping of map 106 may be determined according to the present K-law algorithm techniques, and a bits-to-level look-up table that may be used by inverse quantizer 108 may be determined according to the present R-Lloyd algorithm techniques.

The respective processing modules of non-uniform A/D converter 102 are substantially similar to those of non-uniform D/A converter 100, but function substantially in reverse. That is, an input analog voltage 114, or $x_A(k)$, is sampled by a sampler 116 (i.e., instead of an interpolator). At a non-uniform quantizer 118, the sampled signal is quantized with $2^8$ quantization levels and output as 8-digits-per-sample chips. The 8-digits-per-sample chips are received at map 120, where they are mapped to 15-digits chips and output as an output signal 122, or $x_F(k)$. Similar to D/A converter 100, quantizer 118 and 8-to-15-digits look-up-tables may be determined or controlled by the present K-law or R-Lloyd algorithm techniques.

Figure 2:
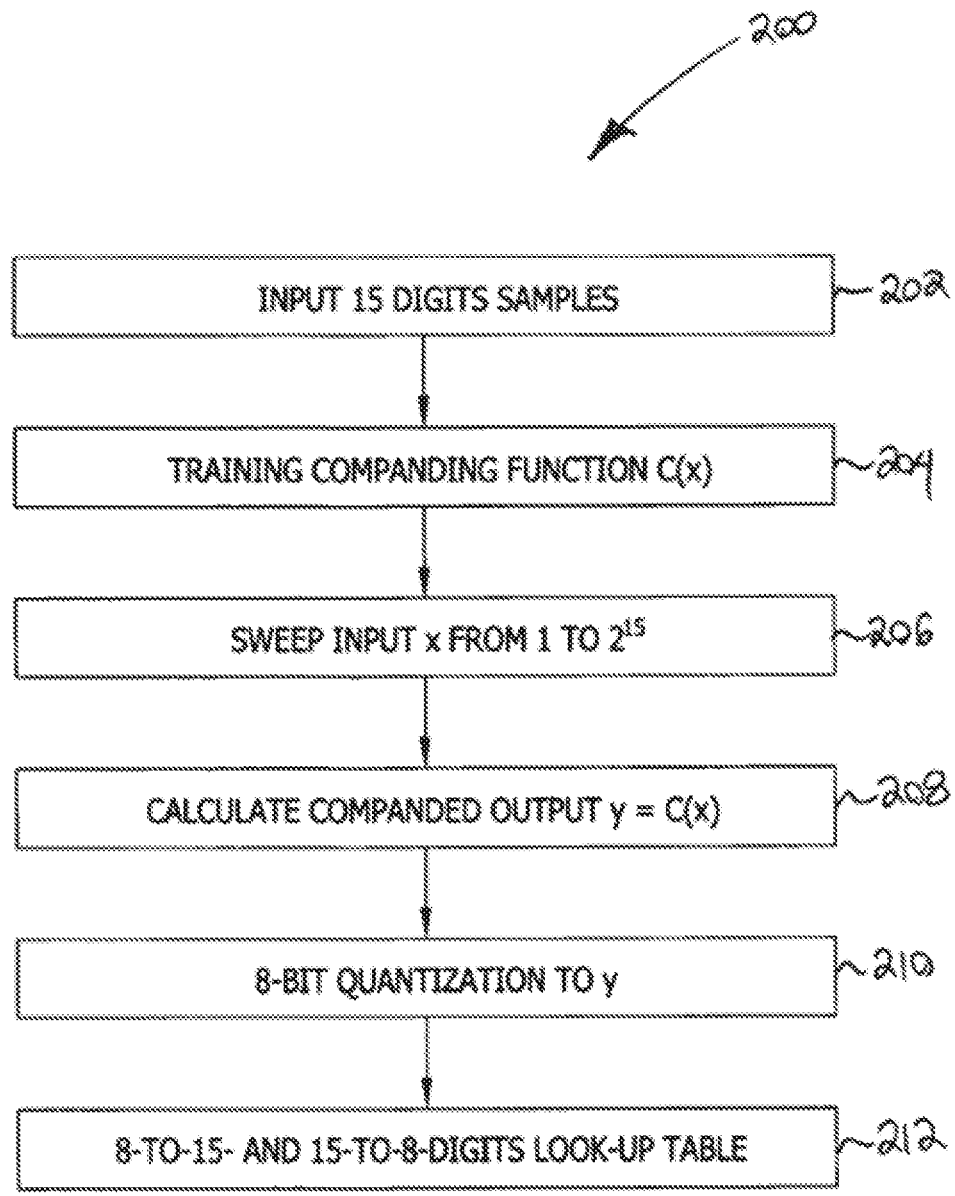
FIG. 2 is a flow diagram for an exemplary K-law algorithm process, according to an embodiment.

FIG. 2 is a flow diagram for an exemplary K-law algorithm process 200. In an exemplary embodiment, process 200 utilizes the present K-law algorithm to generate the 15-to-8-digits look-up table of map 106, FIG. 1A, and the 8-to-15-digits look-up table for map 120, FIG. 1B, as well as non-uniform quantizers 108, 118, respectively.

Process 200 begins at step 202, in which the 15 digit samples are input to D/A converter 100, FIG. 1. In an alternative embodiment of step 202, process 200 operates in reverse, and is applied to the input signal of A/D converter 102. In step 204, the input samples are subject to a training companding function, $C(x)$, which, in K-law, may be represented according to:

$$C(x) = \frac{1}{\Delta}\mathrm{erf}\left(\frac{Kx}{\sqrt{2}}\right), \; x \in [0, 1] \qquad \text{(Eq. 1)}$$

where $\Delta = 1 - 2\Phi(-K)$, $\Phi$ is the cumulative distribution function (CDF) of the standard Gaussian distribution, and x is the normalized modulus of the input signal. In K-law, K is the key parameter to be configured, and the modulus of the OFDM signal is assumed to be distributed on $[0+K\sigma]$, where $\sigma$ is the standard deviation.

In step 206, the normalized modulus x of the input signal is swept from $1\text{-}2^{15}$ times. In step 208, the companded output $y=C(x)$ is calculated. In step 210, the output y is subject to 8-bit quantization. In step 212, process 200 implements the 8-to-15-bit lookup table (or the 15-to-8-bit lookup table for the other converter). The practical value of the K-values calculated according to process 200 are described further below with respect to FIG. 3.

Figure 3:
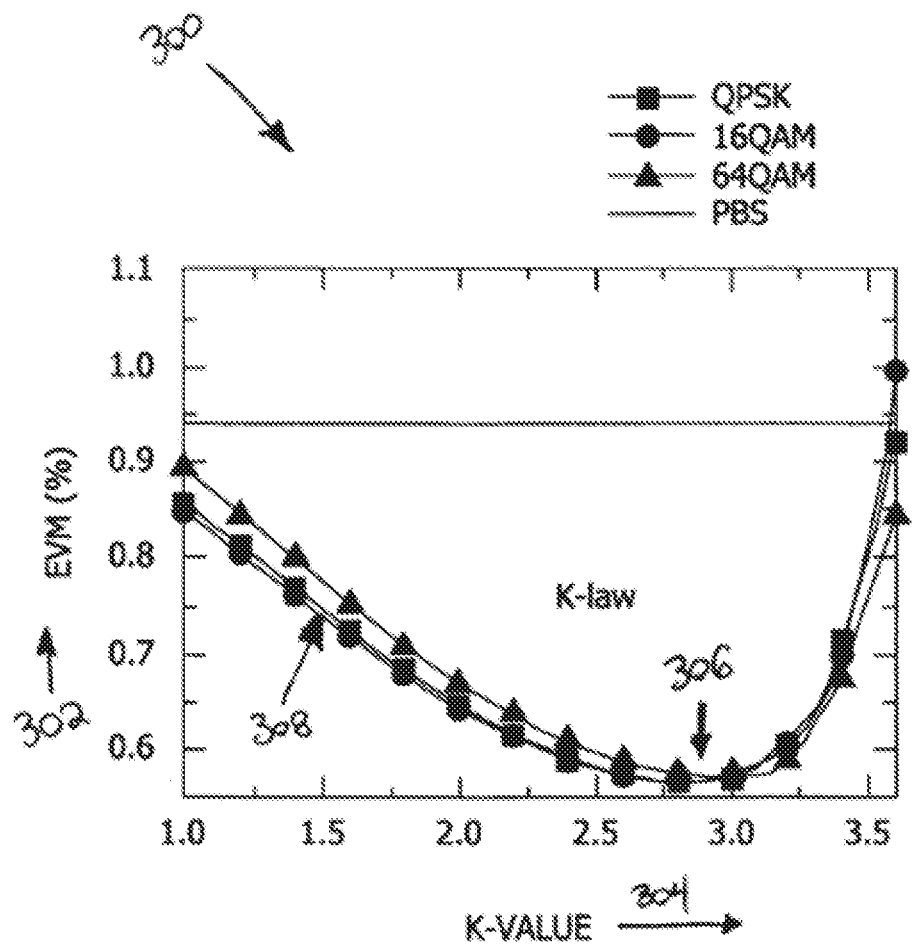
FIG. 3 is a graphical illustration comparing the error-vector-magnitude of an OFDM signal against the K-value, applying the K-law algorithm process depicted in FIG. 2 on the non-uniform analog-to-digital converter depicted in FIG. 1B.

FIG. 3 is a graphical illustration 300 comparing the error-vector-magnitude (EVM) 302 of an OFDM signal against the K-value 304, applying K-law algorithm process 200, FIG. 2, on non-uniform A/D converter 102, FIG. 1B. In an exemplary embodiment, illustration 300 shows the EVM performance of a one-frame LTE-like OFDM signal carrier modulated by QPSK, 16 QAM, or 64 QAM with 286720 samples. From the experimental results shown in illustration 300, it can be seen that an optimal point 306 on distribution curves 308 occurs at a K value of about 2.7.

These K-law techniques enable fast statistical estimation. Nevertheless, a more accurate technique for selecting quantization levels uses a Lloyd algorithm, and further based on minimum mean-square error criterion (MMSE). Prior to performance of the Lloyd algorithm, the probability density function (PDF) of the signal amplitudes is divided into multiple segments and the borders of each segment are given by the thresholds $[t_i, t_{i+1}]$. After quantization, the amplitude falls within each segment is quantized as level $l_i$. The MISE between the quantized and original signals, $\{t_i\}$ and $\{t_i\}$, may then be minimized according to the following equations:

$$l_i = \frac{\int_{t_{i-1}}^{t_i} x f(x) dx}{\int_{t_{i-1}}^{t_i} f(x) dx}, \qquad \text{(Eq. 2)}$$

and:

$$t_i = \frac{l_i + l_{i+1}}{2}, \qquad \text{(Eq. 3)}$$

where f(x) is the PDF of signal modulus.

Figure 4A:
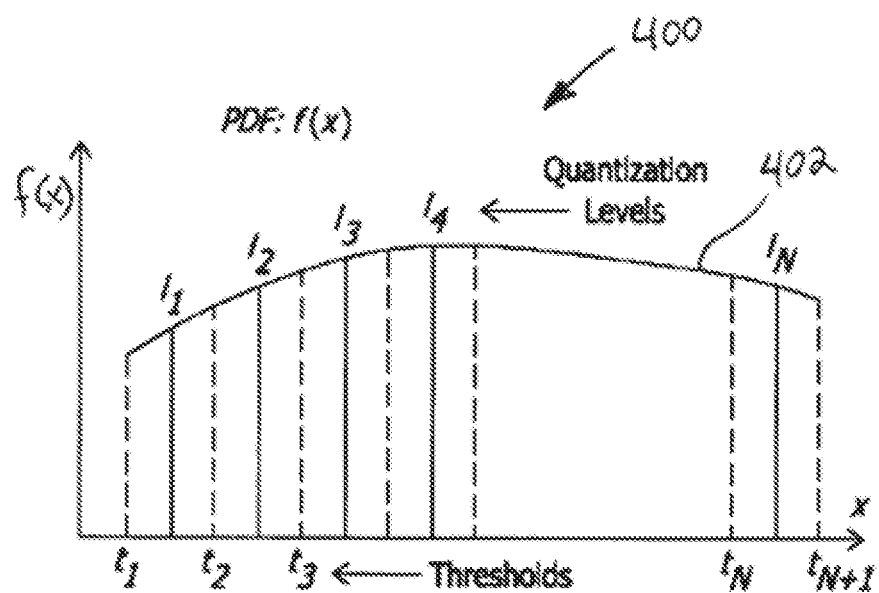
FIG. 4A is a graphical illustration depicting an operation principle of a relaxed Lloyd algorithm with respect to a probability density function, according to an embodiment.
Figure 4B:
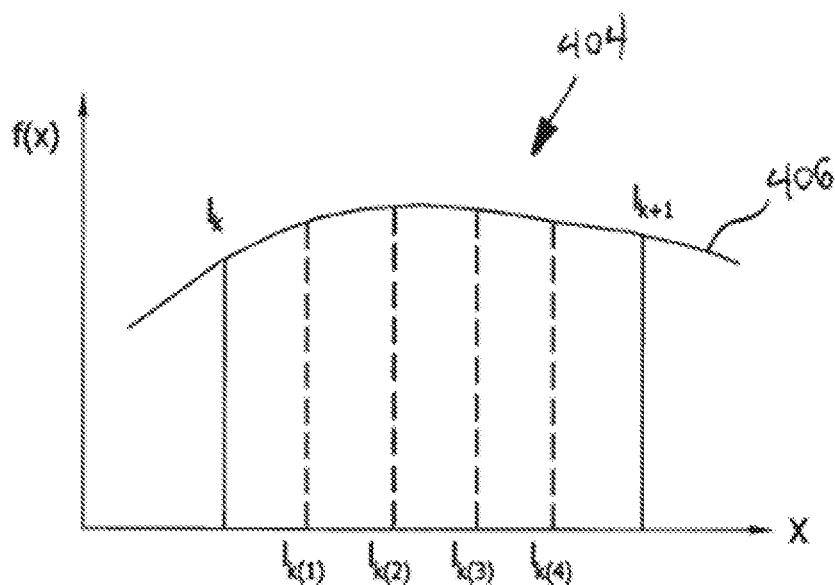
FIG. 4B is a graphical illustration depicting an operation principle of a relaxed Lloyd algorithm with respect to quantization levels, according to an embodiment.

FIG. 4A is a graphical illustration depicting an operation principle 400 of the relaxed Lloyd algorithm with respect to PDF 402. Principle 400 thus demonstrates the effect of decision thresholds $t_i$ and quantization levels $l_i$ on PDF 402 of x. FIG. 4B is a graphical illustration depicting an operation principle 404 of the relaxed Lloyd algorithm with respect to quantization levels 406. Principle 404 thus demonstrates the effect of interpolation of minor quantization levels 406. A flow diagram of a quantization process using the relaxed Lloyd algorithm is described further below with respect to FIG. 5.

Figure 5:
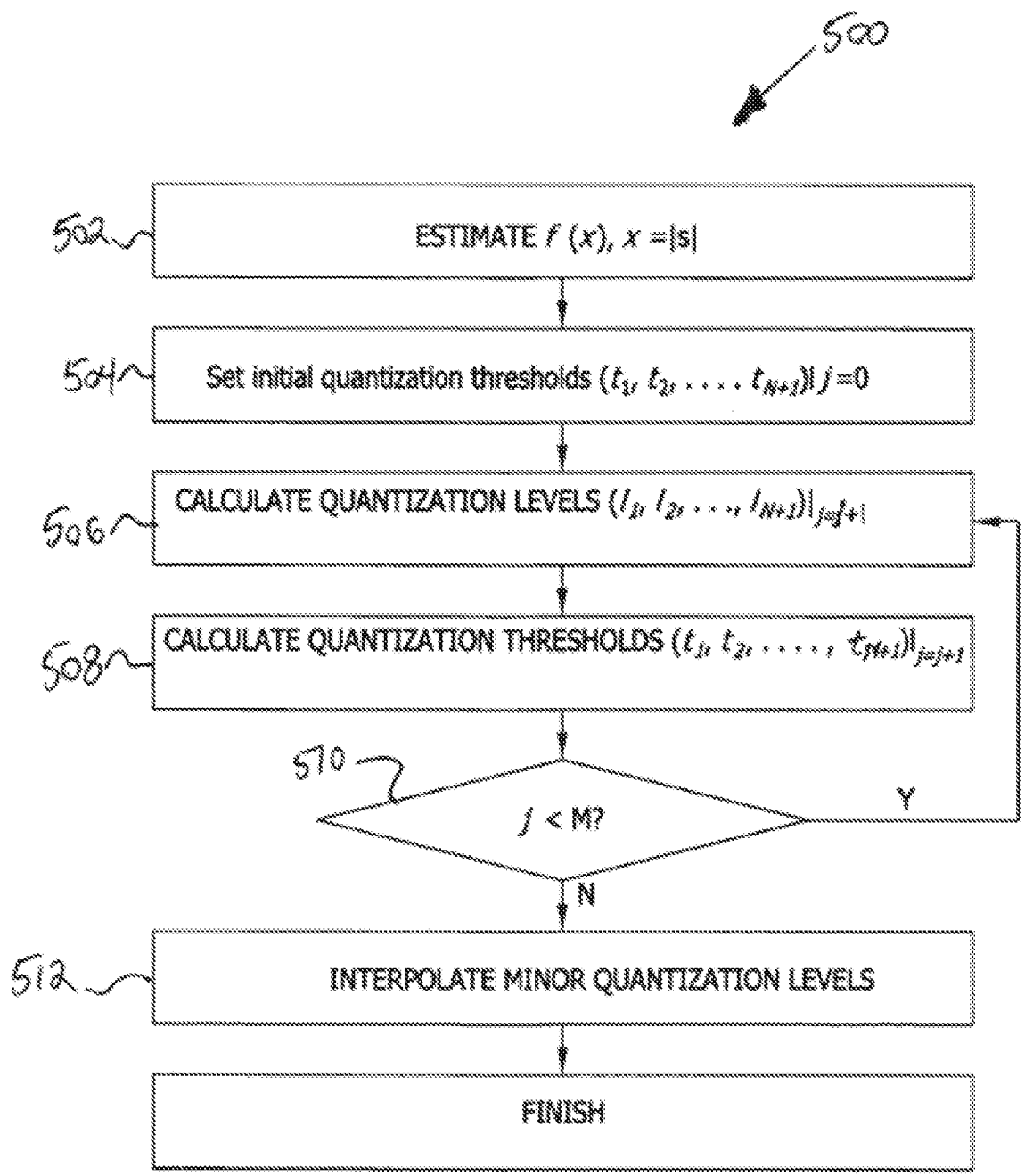
FIG. 5 is a flow diagram for a quantization process, according to an embodiment.

FIG. 5 is a flow diagram for a quantization process 500. In an exemplary embodiment, quantization process 500 is implemented by, within, or in association with, one or both of quantizers 108, FIG. 1A, and 118, FIG. 1B. Process 500 begins at step 502, in which process 500 estimates f(x), with x−|s|. In step 504, the quantization thresholds are initiated as $(t_1, t_2, \ldots t_{N+1})|j=0$, or $(t_{1,0}, t_{2,0}, \ldots t_{N+1,0})$, where $N=2^p$ and p presents the number of major digits. In an exemplary embodiment of step 504, selection of the initial quantization thresholds uses boundaries of uniformly distributed segments. In step 506, the quantization levels $(l_{1,1}, l_{2,1}, \ldots l_{N,1})$ are calculated using $(t_{1,0}, t_{2,0}, \ldots t_{N+1,0})$ based on Eq. 2.

In step 508, the quantization thresholds $(t_{1,1}, t_{2,1}, \ldots t_{N+1,1})$ are similarly obtained, using $(l_{1,1}, l_{2,1}, \ldots l_{N,1})$, and according to Eq. 3. Step 510 is a decision step. In step 510, process 500 determines whether the value for j is less than a predetermined value M of the iteration index. If, in step 510, j<M, process 500 returns to step 506. In this manner, process 500 is able to process a repeatable loop such that the quantization thresholds and quantization levels are repeatedly updated, based on the former value of their counterpart, until the iteration index reaches M (i.e., j=M), upon which process 500 proceeds to step 512. In step 512, process 500 is configured to interpolate minor quantization levels $(l_{K\,(1)}, l_{K(2)}, \ldots l_{(q)})$ such that the minor quantization levels are uniformly inserted between $l_K$ and $l_{K+1}$, where q represents the number of minor digits. Process 500 completes after step 512.

In an exemplary embodiment of process 500, the selection of p and q may be optimized according to a trade-off between the quantization accuracy and computational complexity. Typically, a large p value leads to improved precision at the expense of increased number of iterations to be converged. In contrast, if the value for p is too large, strong quantization noise may result within small-probability-density regions due to the number of training samples falling into that region being insufficient, thus reducing the confidence level of the estimation. Considering all of these factors, given a total number of digits of D, the value for p may be set at 5, and the value for q may be determined according to q=(D−5). A comparison of preliminary results between the different algorithms is described further below with respect to FIG. 6.

Figure 6A:
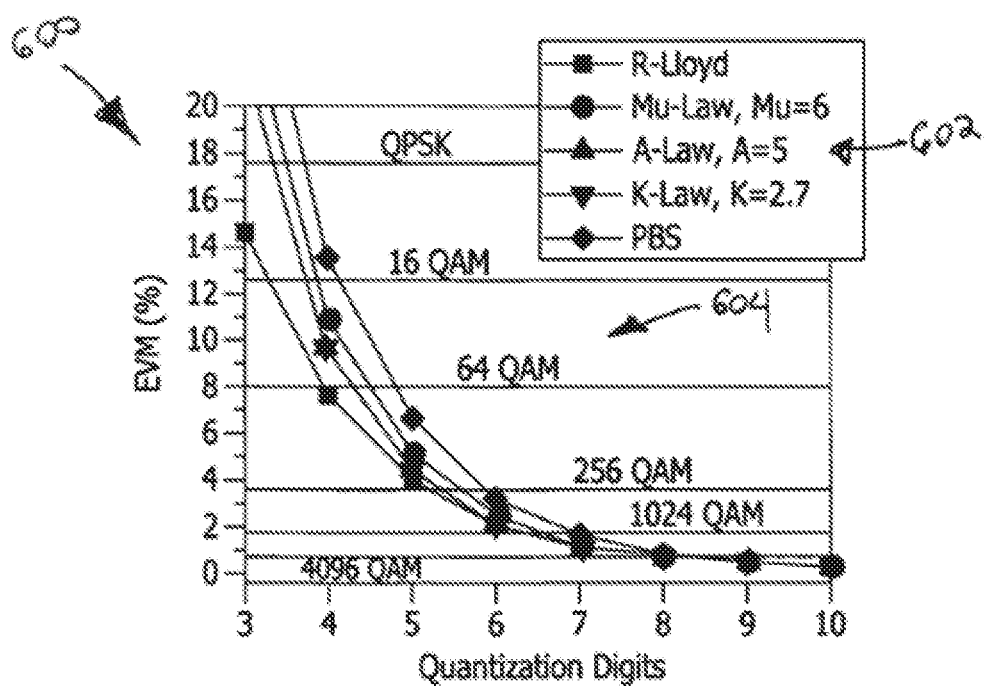
FIGS. 6A-D are graphical illustrations of the error-vector-magnitude against a number of quantization digits for different algorithms, according to an embodiment.
Figure 6B:
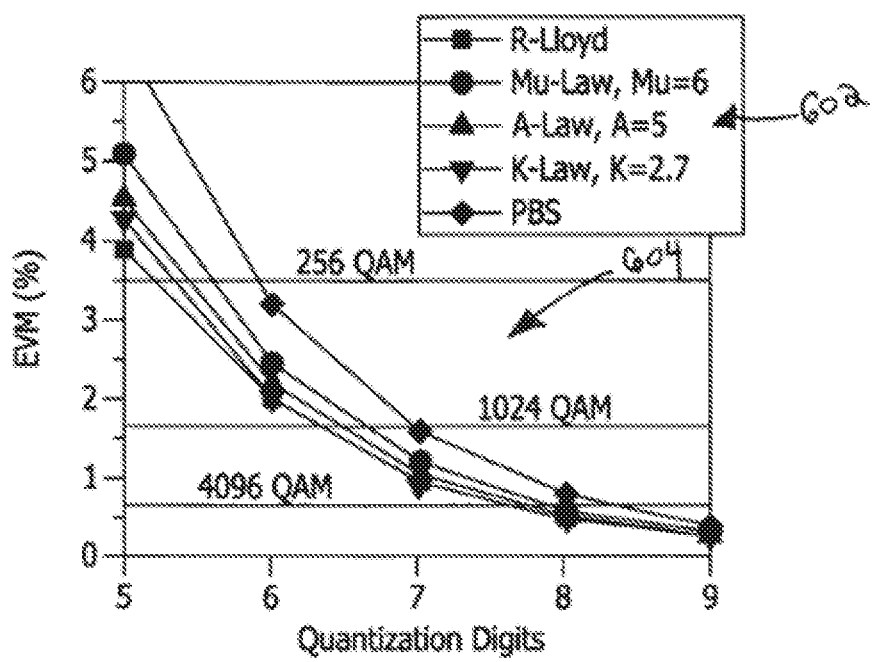
Figure 6C:
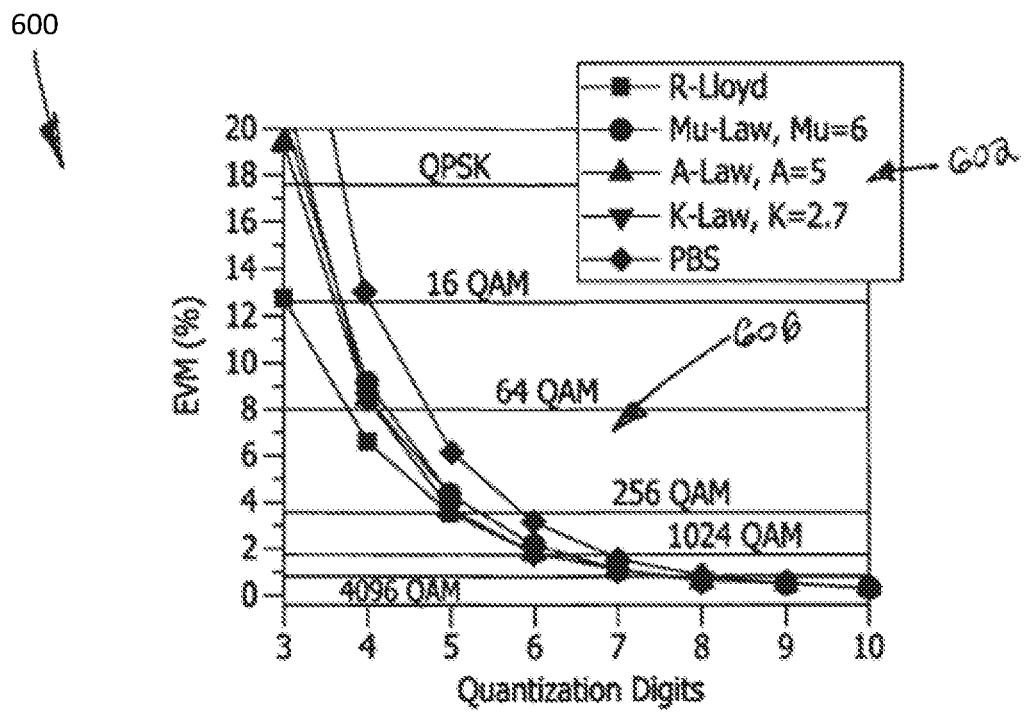
Figure 6D:
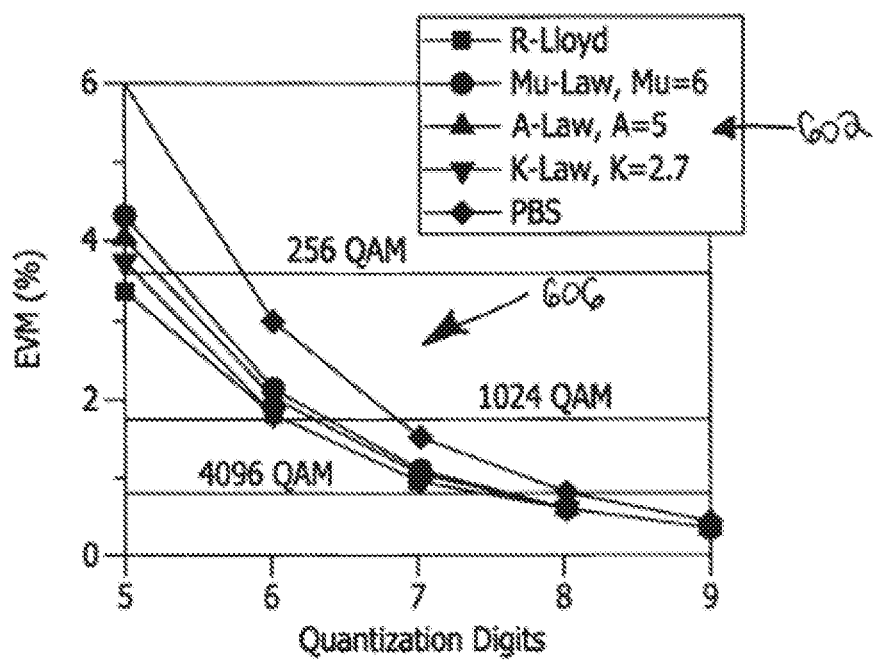

FIGS. 6A-D are graphical illustrations 600 of EVM against a number of quantization digits for different algorithms 602. More particularly, FIG. 6A illustrates a comparative plot 604 of EVM versus quantization digits using pulse coding modulation (PCM) for the several different algorithms 602. FIG. 6B illustrates a close-up view of a portion of comparative plot 604. FIG. 6C illustrates a comparative plot 606 of EVM versus quantization digits using differential PCM (DPCM) for the several different algorithms 602. FIG. 6D illustrates a close-up view of a portion of comparative plot 606. As can be seen from comparative plots 604 and 606, optimal EVM performance is obtained using the present R-Lloyd non-uniform quantizer algorithm, and particularly in the case where 3-6 quantization digits are applied.

As described above, the non-uniform quantizer embodiments described herein are capable of reducing the number of sampling digits, and also of suppressing the quantization noise levels. As described further below, the present non-uniform quantizer is also particularly useful with respect to D-RoF and D-RFoG systems. As described above, D-RoF interfaces have been used in MFH systems, such as CPRI and the open base station architecture initiative (OBSAI), which converts the analog radio signals into digital format and delivers digitized baseband radio carriers from a radio equipment controller (REC) to radio equipment (RE). According to the embodiments described above, using a sufficient number of quantization digits and FEC, the digitized radio carriers may be advantageously reconstructed by a D/A converter with no quality degradation.

The present embodiments are still further useful for achieving significant benefits, in comparison with conventional techniques, over a D-RFoG link between a hub and distributed remote fiber nodes. The present techniques are format-agnostic, with simple hardware implementation, at the distributed remote fiber nodes. The present techniques are still further capable of taking advantage of the digitization benefits of the link, including the high immunity to nonlinear distortions from power amplification. Essentially error-free transmission may therefore be achieved through use of FEC, enabled by the high capacity from the fiber network. In combination with the non-uniform quantizer the systems and methods described herein, the required number digits and quantization noise floor for converting each analog sample may be further reduced, thereby significantly increasing the capacity of the D-RFoG systems in comparison with conventional techniques.

FIG. 7 is a schematic illustration of a digital transmitter 700. In an exemplary embodiment, transmitter 700 is configured for operation within a D-RFoG system/network, and is capable of executing DPCM, as well as the K-law aunt/or R-Lloyd based non-uniform quantizers and algorithms described above. More particularly, transmitter 700 may include one or more of an analog signal input 702, a high-resolution A/D converter 704, a DPCM encoder 706, a bit map 708, and a modulator 710 in operable communication with a channel 712. In exemplary operation of transmitter 700, implementation of DPCM with at least one of the present non-uniform quantizers will significantly minimize the quantization noise. In this respect, DPCM encoder 706 is configured to include one or more of a compression unit 714, a quantizer 716, and expander unit 718, and a feedback circuit 720. Feedback circuit 720 may further include a filter 722, which may be a one-tap finite impulse response (FIR) filter having a response function defined by $C(z)=\beta z^{-1}$, where the $\beta$ is the tap coefficient, and may have a large impact on the quantization performance.

FIG. 8 is a schematic illustration of a digital receiver 800. Similar to the embodiments described above, receiver 800 is similar to transmitter 700, FIG. 7, in its structural architecture, but essentially operating in reverse order. More particularly, receiver 800 may include one or more of a channel input 802, a demodulator 804, a bit map 806, a DPCM decoder 808, and a D/A converter 810 configured to output an analog signal 812. In exemplary operation, DPCM decoder 808 is configured to have a feedback circuit 814 that corresponds to feedback circuit 722 of transmitter 700.

Figure 9:
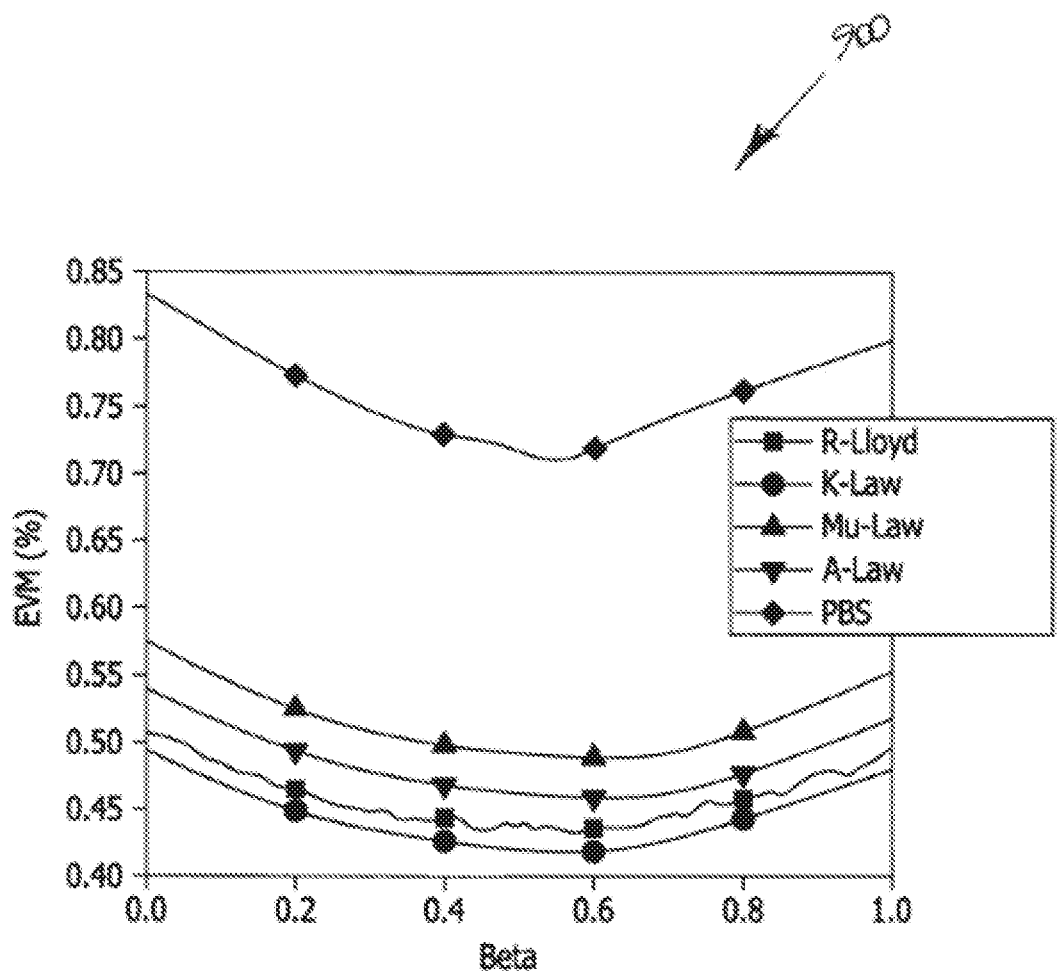
FIG. 9 is a graphical illustration of the error-vector-magnitude against tap coefficients, according to an embodiment.

FIG. 9 is a graphical illustration 900 of EVM against tap coefficients. In an exemplary embodiment, graphical illustration 900 depicts the EVM of analog signals 812 from receiver 800, FIG. 8, versus the tap coefficient $\beta$. As can be seen from graphical illustration 900, for a one-frame OFDM signal having 20×7 symbols, 2048 total subcarriers, and 1201 loaded subcarriers, optimal performance is achieved for values of $\beta \approx 0.6$.

Data-Compression for Digital Mobile Fronthaul with Algorithm and Differential Coding The differential-coded Lloyd algorithms described above are also particularly useful as a data-compression technology for improving bandwidth efficiencies in digital MFH networks. The following embodiments demonstrate proof of concept with respect to experimental results demonstrating milestone transmissions of 180 Gbps over 80-km fronthaul links, and encapsulating 64×100-MHz 1024-QAM 5G-NR carriers with lower-than-0.5% EVM.

Figure 10:
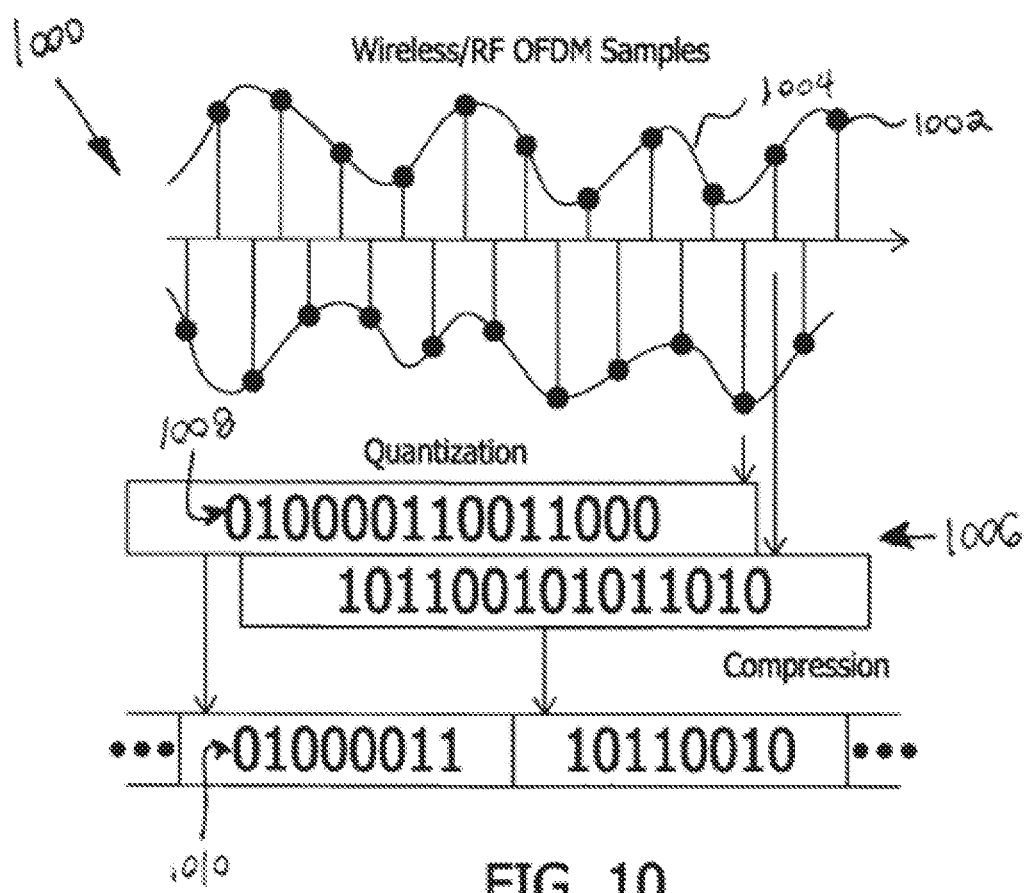
FIG. 10 is a graphical illustration depicting an operating principle of a Lloyd algorithm on the quantization process depicted in FIG. 5.

FIG. 10 is a graphical illustration depicting an operating principle 1000 of a Lloyd algorithm on quantization process 500, FIG. 5. In an exemplary embodiment, operating principle 1000 leverages the operational results shown in FIG. 4A for a digital RoF or MFH system. In exemplary operation of operating principle 1000, samples 1002 are taken of an analog wireless OFDM waveform 1004 to form a discrete signal. The discrete signal is then quantized into U levels and converted into a binary AxC chip 1006 having U digits 1008. The value for U may be obtained, for example, according to the CPRI standard setting U=15. Each AxC chip 1006 is then subject to compression, and mapped from U digits 1008 to V digits 1010.

In the exemplary embodiment, V<U, and the bandwidth efficiency may therefore be improved according to the relationship (U−V)/V×100%. As described above, the Lloyd algorithm is based on MMSE criterion, and divides the PDF of the signal amplitudes into multiple segments with boundaries defined by the thresholds $[t_i, t_{i+1}]$ as shown in FIG. 4A. After quantization, the amplitudes falling into each segment may then be quantized as level $l_i$. To minimize MSE between the quantized and original signals, $\{t_i, t_{i+1}\}$ and $l_i$ may be related through implementation of Eq. 2 and Eq. 3, where f(x) represents the PDF of signal amplitudes. The flow diagram of this relaxed Lloyd algorithm is described above with respect to FIG. 5, i.e., process 500, which follows substantially the same order as described above. Using this process, both quantization levels and thresholds gradually converge to the positions resulting in the minimum MSE between original and quantized signals.

In the case of a compressed AxC chip 1006 having V digits 1010, an R-Lloyd method may be further implemented to reduce the complexity of the conventional Lloyd algorithm, where $2^P$ out of $2^V$ levels are computed using the conventional Lloyd algorithm first as the major levels and $2^{(V-P)}$ minor quantization levels are uniformly interpolated between $[l_i, l_{i+1}]$. The selection of P and V may therefore be determined by a trade-off between the quantization accuracy and convergence speed, similar to the embodiments described above.

Figure 11:
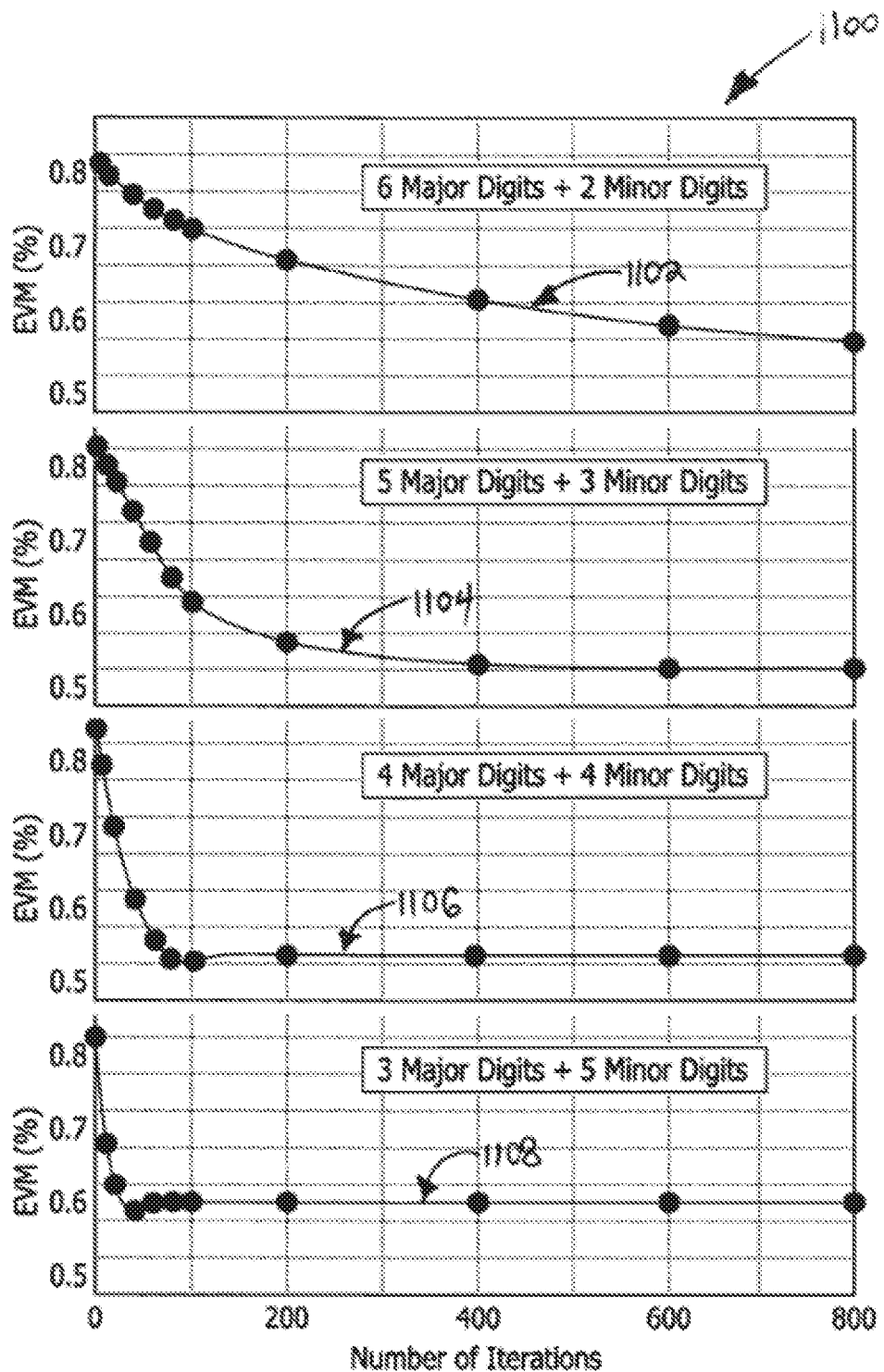
FIG. 11 is a graphical illustration depicting the error-vector-magnitude against a number of iterations and digits, according to an embodiment.

FIG. 11 is a graphical illustration 1100 depicting EVM against a number of iterations and digits. More particularly, illustration 1100 depicts a first EVM curve 1102 against iterations for six major digits and two minor digits. Similarly, a second EVM curve 1104 is depicted for five major digits and three minor digits, a third EVM curve 1106 is depicted for four major digits and four minor digits, and a fourth EVM curve is depicted for three major digits and five minor digits. Therefore, from illustration 1100, the convergence speed of the OFDM EVM may be observed for the application of different numbers of major digits (e.g., under 15-to-8-digits compression, or U=15 and V=8). As demonstrated in illustration 1100, with fewer major digits, faster convergence speed may be achieved with fewer iterations. According to EVM curve 1106, in the case where 4 major digits (P=4) are applied, the converged EVM value can be obtained with approximately 100 iterations. In the particular examples illustrated in FIG. 11, and optimal balance between complexity and accuracy is reached using 4 and 5 major digits.

Figure 12A:
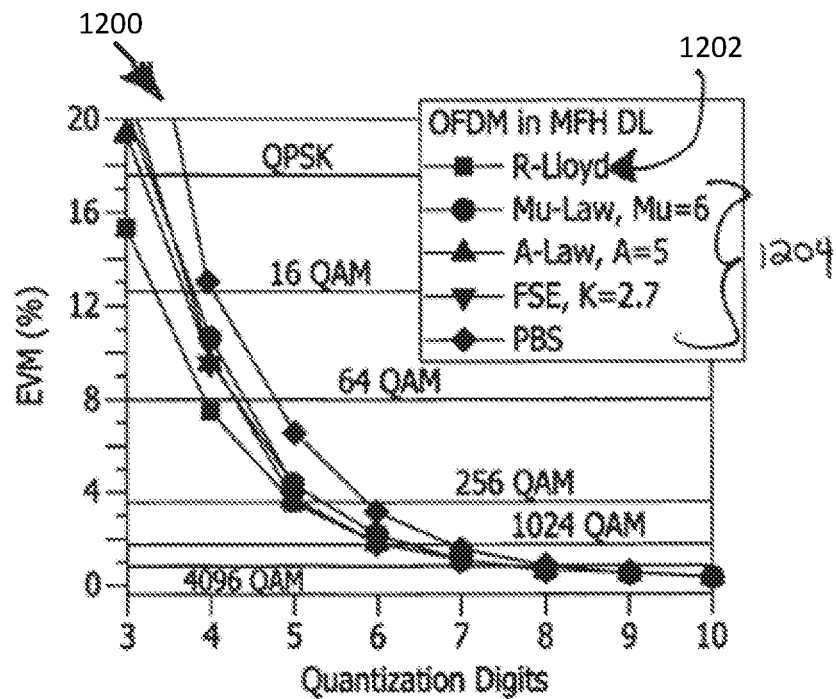
FIG. 12A is a graphical illustration depicting the error-vector-magnitude against quantization digits with respect to a Lloyd algorithm used for OFDM, according to an embodiment.
Figure 12B:
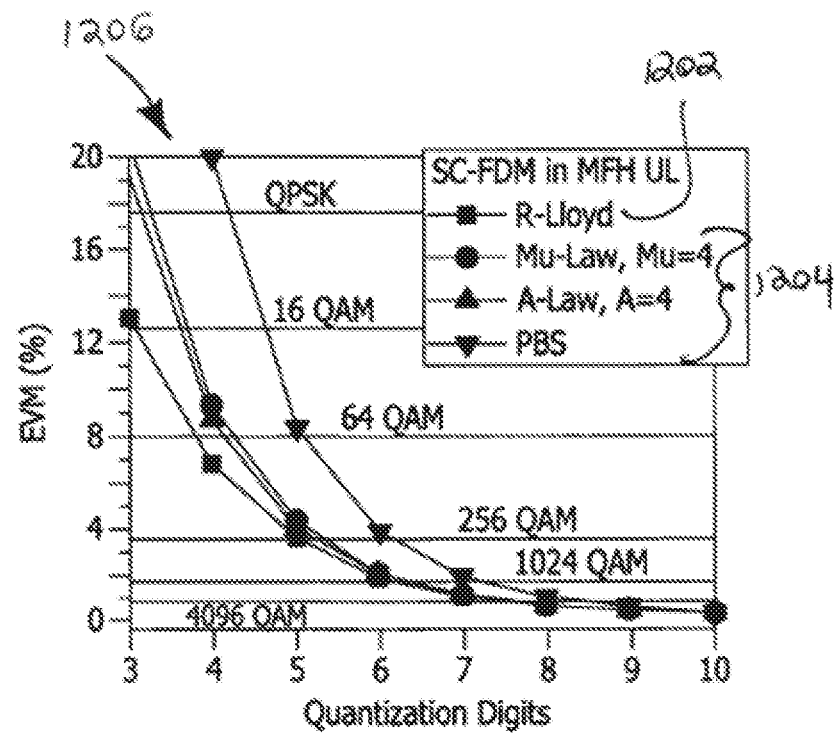
FIG. 12B is a graphical illustration depicting the error-vector-magnitude against quantization digits with respect to a Lloyd algorithm used for SC-FDM, according to an embodiment.

FIG. 12A is a graphical illustration 1200 depicting EVM against quantization digits with respect to a Lloyd algorithm 1202, in comparison with other algorithms 1204, used for OFDM. FIG. 12B is a graphical illustration 1206 depicting EVM against quantization digits with respect to Lloyd algorithm 1202 and other algorithms 1204 used for single carrier frequency division multiplexing (SC-FDM). More particularly, illustrations 1200, 1206, depict the EVM performance of OFDM and SC-FDM radio signals, respectively, after 15-to-8-digit compression and de-compression.

From illustrations 1200, 1206, it can be seen that, in comparison other algorithms 1204 (e.g., μ-Law, A-Law, FSE, etc.), R-Lloyd algorithm 1202 is capable of realizing the most optimal EVM performance, and using fewer quantization digits. Additionally, although some algorithmic methods (e.g., FSE) are specially designed for OFDM signals having Gaussian distributed amplitudes these and other algorithms are not applicable to non-Gaussian signals, such as SC-FDM. According to the present embodiments though, performance of the present Lloyd algorithm techniques is independent of the statistical property of the given signal. That is, the same algorithmic techniques may be applied to Gaussian and non-Gaussian signals, as demonstrated by illustration 1206. As shown in FIG. 12B, acceptable EVM values may still the obtained when using Lloyd algorithm to compress SC-FDM radio signals. In the examples depicted in FIGS. 12A-B, the required EVM thresholds of 64-, 256-, 1024-, and 4096-QAM are set at 8%, 3.5%, 1.68%, and 0.7%, respectively.

The present systems and methods are additionally capable of advantageously applying DPCM techniques to further improve the signal quality after compression. In comparison with conventional PCM, which digitizes the original radio signal x(k), DPCM may be additionally utilized to predict and digitize the differential signal, namely, x(k)−x(k−1). For DPCM, most source signals exhibit some correlations between successive samples. Through differential precoding, the correlation-induced redundancy may be reduced to enable representation of the information with fewer digits. To reduce the corresponding complexity, a first-order differentiator may be used, and having pre-coded signals, which are denoted here as d(k)=x(k)−βx(k−1).

Under simulated test conditions, the value of β was found to be optimized at the value of 0.6. Nevertheless, DPCM implementations may exhibit specific challenges with respect to the quantization error resulting from the compression process, and the decision error exhibited at the DPCM decoder. Those two types of errors propagated and accumulated from the beginning to the end of the whole frame, which may seriously degrade the quality of the reconstructed analog RF signals. The embodiments described further below resolve these challenges by providing a feedback loop-based differential quantizer that mitigates the quantization error transfer issue.

Figure 13A:
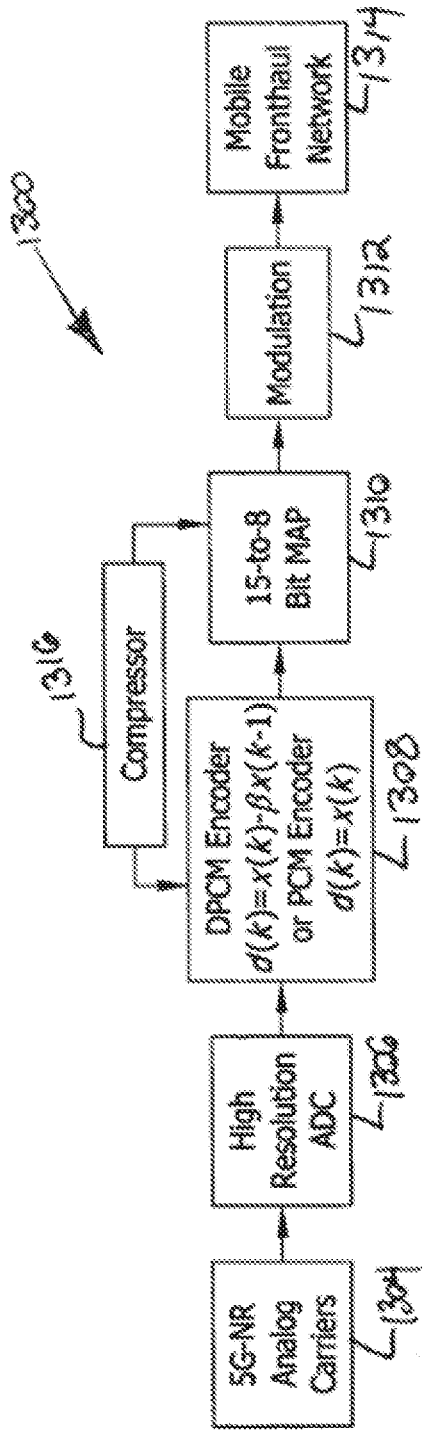
FIG. 13A is a schematic illustration of a D-RoF transmitter, according to an embodiment.
Figure 13B:
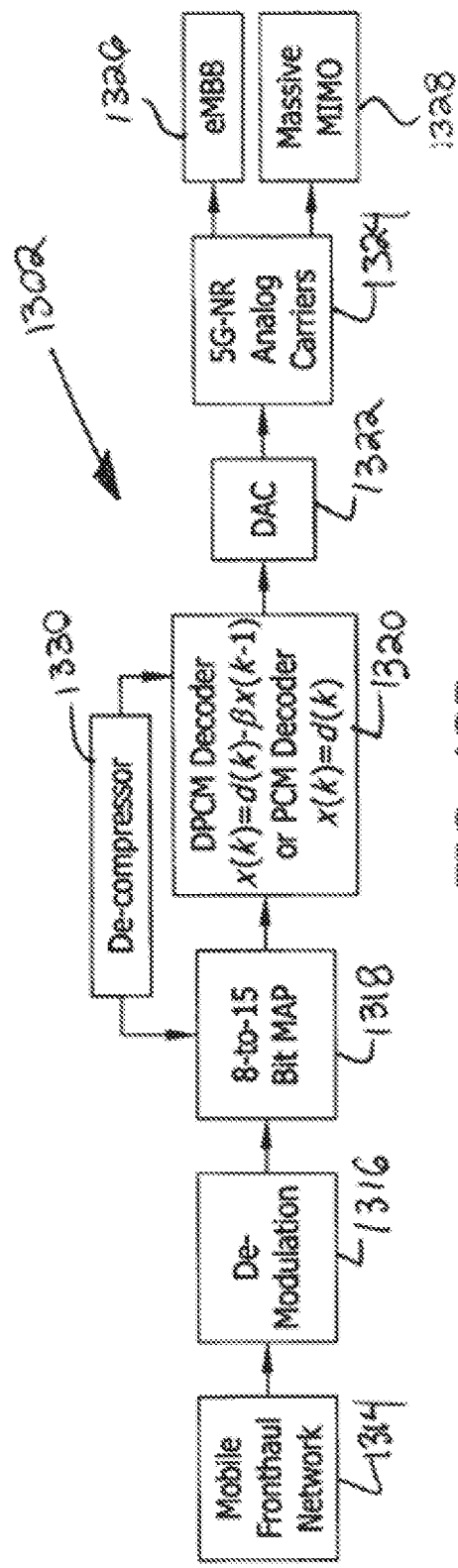
FIG. 13B is a schematic illustration of a D-RoF receiver, according to an embodiment.

FIG. 13A is a schematic illustration of a D-RoF transmitter 1300. FIG. 13B is a schematic illustration of a D-RoF receiver 1302. In the exemplary embodiment, transmitter 1300 and receiver 1302 are implemented with respect to a 5G MFH system. Transmitter 1300 may include one or more of 5G-NR analog carriers 1304 being input to a high-resolution A/D converter 1306, a DPCM encoder 1308, a bit map 1310, and a modulator 1312 that outputs a signal to MFH network 1314. In an exemplary embodiment, transmitter 1300 further includes a compression unit 1316 in operable communication with one or both of D PCM encoder 1308 and bit map 1310. In at least one embodiment, transmitter 1300 may substitute a PCM encoder for DPCM encoder 1308.

In a similar manner, receiver 1302 provides a signal from MFH network 1314 to a demodulator 1316, and may further include one or more of a bit map 1318, a DPCM decoder (or PCM decoder) 1320, and a D/A converter 1322 configured to output 5G-NR analog carriers 1324 to one or both of an enhanced mobile broadband (eMBB) network 1326 and a massive MIMO network 1328. In this example, receiver 1302 further includes a de-compression unit 1330 in operable communication with one or both of bit map at 1318 and DPCM decoder 1320.

Under test conditions, a simple IM/DD link tests the performance of the compressed D-RoF link of transmitter 1300 and receiver 1302. At transmitter 1300, for example, one 20-MHz LTE OFDM component is sampled with a resolution of 15-digits/sample, and at a sampling rate of 30.72-MHz. DPCM (or PCM) encoder 1308, integrated with a Lloyd-based according to the present embodiments, converts the quantized samples into binary AxC chips. Bit map 1310 (e.g., a 15-to-8-bit map) then compresses each AxC chip from 15-bits/chip to 8-bits/chip. The compressed AxC chips may then be interleaved and mapped into NRZ symbols.

At receiver 1302, a similar process, but in reverse, may be implemented to reconstruct the analog components by decompressing the received digital signals. The recovered analog component carriers (e.g., analog carriers 1324) may then be sent to wireless antennas in RAUs in networks 1326, 1328. The EVM performances of recovered analog signals 1324 may then be compared between DPCM and PCM encoded schemes, according to one or more of the techniques described above.

Figure 14:
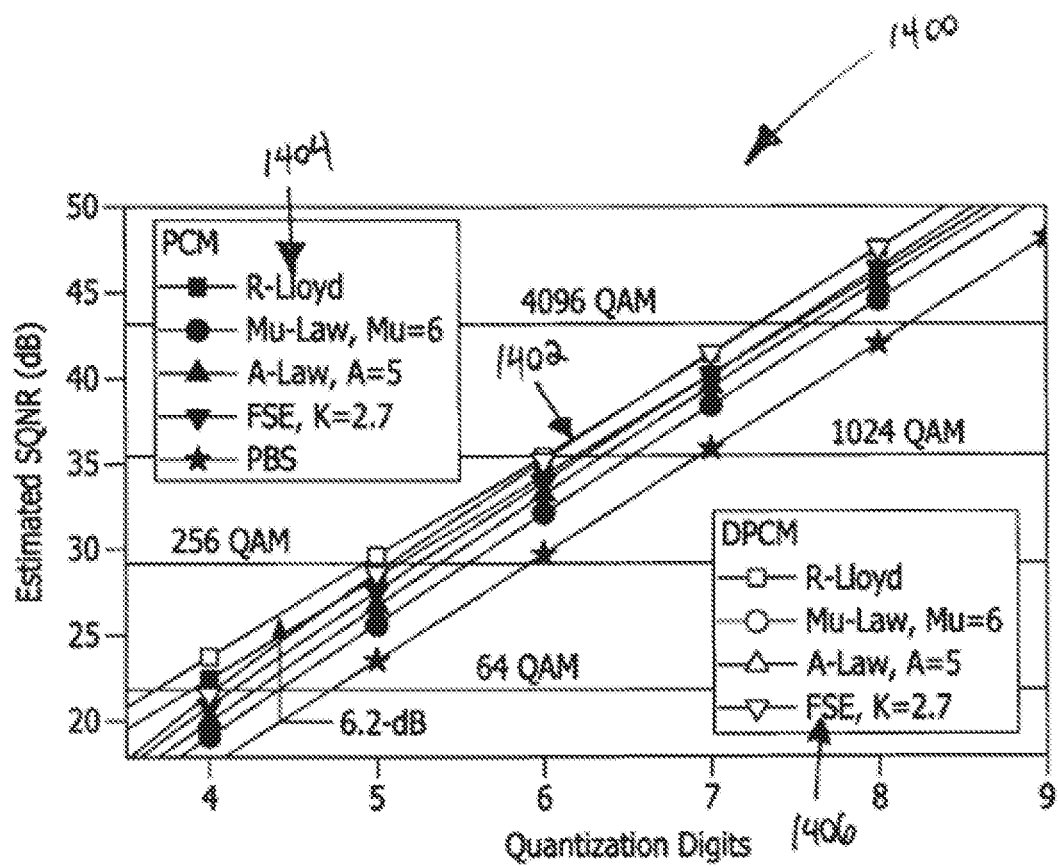
FIG. 14 is a graphical illustration depicting signal-to-quantization-noise ratio as a function of quantization digits, according to an embodiment.

FIG. 14 is a graphical illustration 1400 depicting signal-to-quantization-noise ratio (SQNR) as a function of quantization digits. In the exemplary embodiment depicted in FIG. 14, several plots 1402 of SQNR versus quantization digits are illustrated with respect to a first set of compression techniques 1404 applied to a PCM coding scheme, and a second set of compression techniques 1406 applied to a DPCM coding scheme. From illustration 1400, it may be observed that implementation of a DPCM coding scheme instead of a PCM coding scheme will result in approximately a 1.4 dB improvement in SQNR, that is, according to the estimate SQNR≈VEVM$^2$. Furthermore, in comparison with PBS techniques with low-order digits directly removed, the combination of the present DPCM coding scheme and Lloyd algorithm results in approximately a 6.2-dB gain in SQNR.

Figure 15:
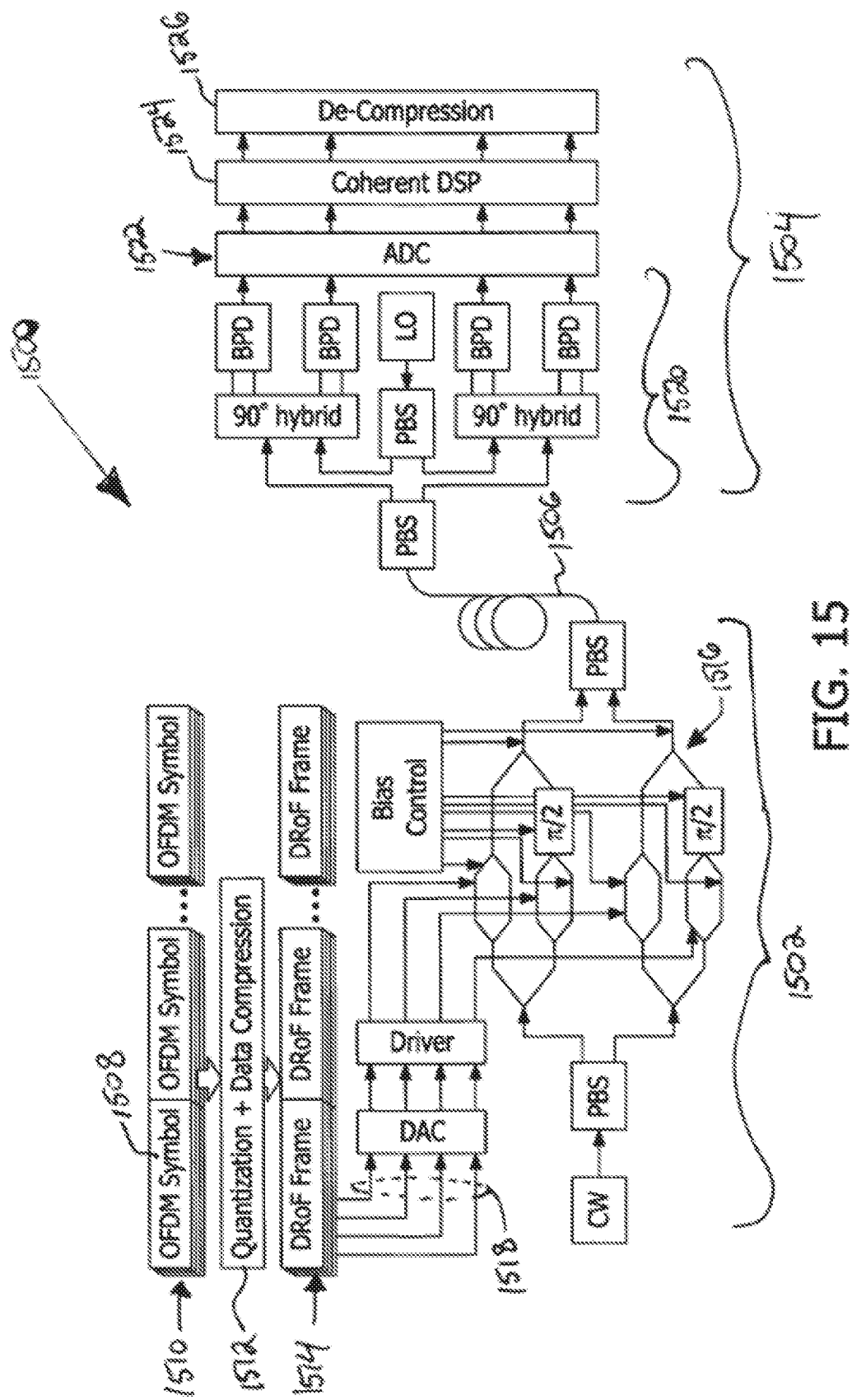
FIG. 15 is a schematic illustration of a digital mobile fronthaul for coherent transmission, according to an embodiment.

FIG. 15 is a schematic illustration of a digital MFH 1500 for coherent transmission. In an exemplary embodiment, MFH 1500 represents a 5G-NR compatible, high-capacity, digital MFH link. MFH 1500 includes a transmitting portion 1502 and a receiving portion 1504, which are configured to communicate over a transport medium 1506 (e.g., an optical fiber, a standard single mode fiber (SSMF), etc.). In operation of MFH 1500, 5G-NR-like OFDM symbols 1508 are digitized and encapsulated into AxC chips 1510, which are interleaved and packetized by a quantization and data compression module 1512, into D-RoF frames 1514.

Frames 1514 fed into a dual-polarization IQ modulator (DP-IQM) 1516, which modulates four streams 1518 of D-RoF signals for I and Q tributaries on both polarizations (e.g., x and y) based on, for example, QPSK modulation formats. Transmitting portion 1502 then transmits the signals to a coherent receiver 1520 of receiving portion 1504 over medium 1506 (e.g., an 80-km SSMF), and then sampled by, for example, a 4-channel real-time sampling oscilloscope 1522 before application of digital signal processing (e.g., off-line) by a coherent digital signal processor 1524 for signal de-compression by a de-compression unit 1526 and recovery. In this exemplary embodiment, the testing operation was accomplished using DP-QPSK with 128- and 180-Gbps data rates applied, which enabled encapsulation of 48 and 64, respectively, 100-MHz 5G-NR-like OFDM components with 1024-QAM.

Figure 16:
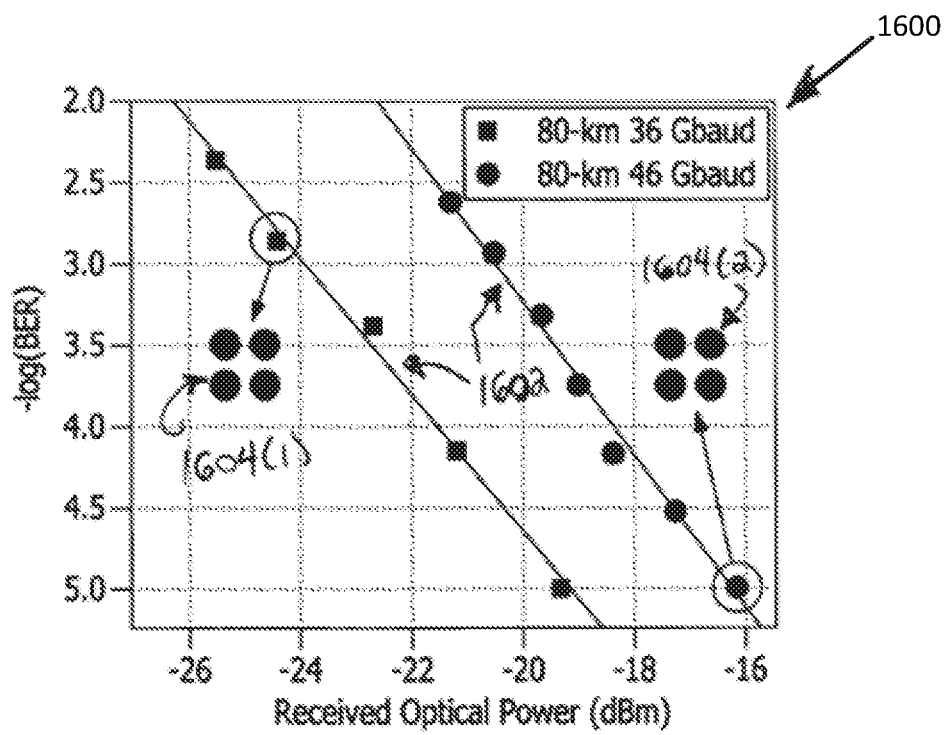
FIG. 16 is a graphical illustration depicting bit error rate versus received optical power, according to an embodiment.

FIG. 16 is a graphical illustration 1600 depicting BER versus received optical power. In the exemplary embodiment illustrated in FIG. 16, BER performance plots 1602 using DP-QPSK, at different Gbaud rates, are depicted for selected constellations 1604 of recovered OFDM signals. In this example, the recovered OFDM signals have 0.46% EVM under error-free coherent transmission. The results of illustration 1600 are considered further below with respect to FIG. 17.

Figure 17:
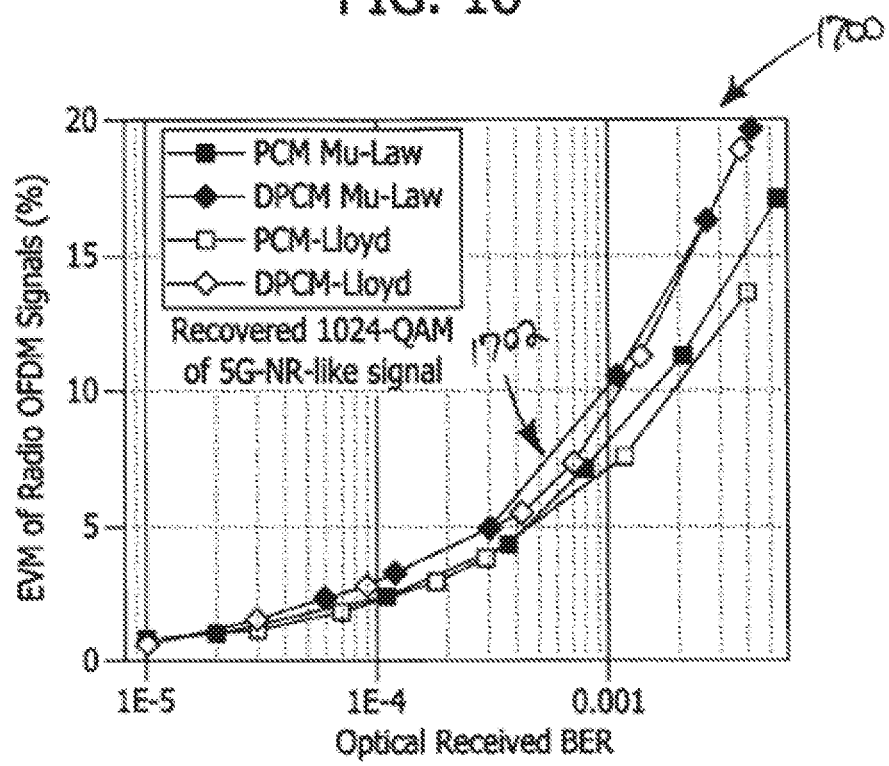
FIG. 17 is a graphical illustration depicting the error-vector-magnitude under the influence of bit errors, according to an embodiment.

FIG. 17 is a graphical illustration 1700 depicting EVM under the influence of bit errors. In the exemplary embodiment illustrated in FIG. 17, illustration 1700 depicts EVM performance plots 1702 of recovered wireless signals under the influence of bit errors (e.g., using a balanced photodetector). That is, under test conditions, the quality of the recovered OFDM signal it is observed while the OFDM signal is under the influence of bit errors. From illustrations 1600 and 1700, it may be seen that, due to the error transfer challenge presented by differential decoding, DPCM coding schemes are more sensitive to bit errors than PCM coding schemes. Nevertheless, this difference may be mitigated by the appropriate application of Reed-Solomon FEC (e.g., RS-FEC 528/514) according to the CPRI specification.

The present systems and methods provide an innovative combination of enhanced data-compression algorithms, which may be based on both a Lloyd algorithm and DPCM, to improve the SQNR and bandwidth efficiency in at least D-RoF systems for next-generation 5G-NR-compatible digital MFH, as well as the other types of communication networks described herein. With 8-digit quantization, the present D-RoF link the embodiments are capable of supporting up to at least 4096-QAM OFDM or SC-FDM formats, with up to at least 6-dB SQNR improvement. Furthermore, the present embodiments have demonstrated how 128- and 180-Gbps high-capacity MFH links based on coherent transmission technology may more efficiently transmit 48×100 and 64×100-MHz 5G-NR-like OFDM components with high-order 1024-QAM format.

High-Order Differentiator-Based Data Compression Systems and Methods

DPCM is not limited to first-order differentiator implementations; instead, DPCM can be implemented with high-order differentiators, i.e. with second-order or higher-order differentiators. Disclosed herein are new data compression systems and methods which may be implemented with high-order differentiators. These new data compression systems and methods use a least means square (LMS)-based filtering method to generate a predicted signal for use with DPCM, which achieves significant advantages compared to conventional techniques.

For example, the new data compression systems and methods may achieve accuracy that is comparable to that of high-order differentiator-based data compression systems using MMSE-based filtering methods ("MMSE-based DPCM systems"), but with significantly greater computational efficiency than is possible with MMSE-based DPCM systems. For instance, certain embodiments do not require solving for an inverse of a correlation matrix, which is necessary in MMSE-based DPCM systems. Additionally, the data compression systems and methods promote high SQNR and bandwidth efficiency. For example, Applicant has found that in some embodiments, the new systems and methods may achieve a SQNR improvement of around 10 dB, as well as achieve a bandwidth efficiency improvement of around 40% to 60%, compared to conventional compression techniques. Furthermore, certain embodiments of the new data compression systems are adaptive, e.g. tap weight vectors are automatically adjusted according to changing statistical properties of original signal waveforms, thereby promoting high performance over varied operating conditions. Moreover, some embodiments of the new data compression systems and methods are conducive to integration in a digital interface of a 5G mobile fronthaul system.

Figure 18:
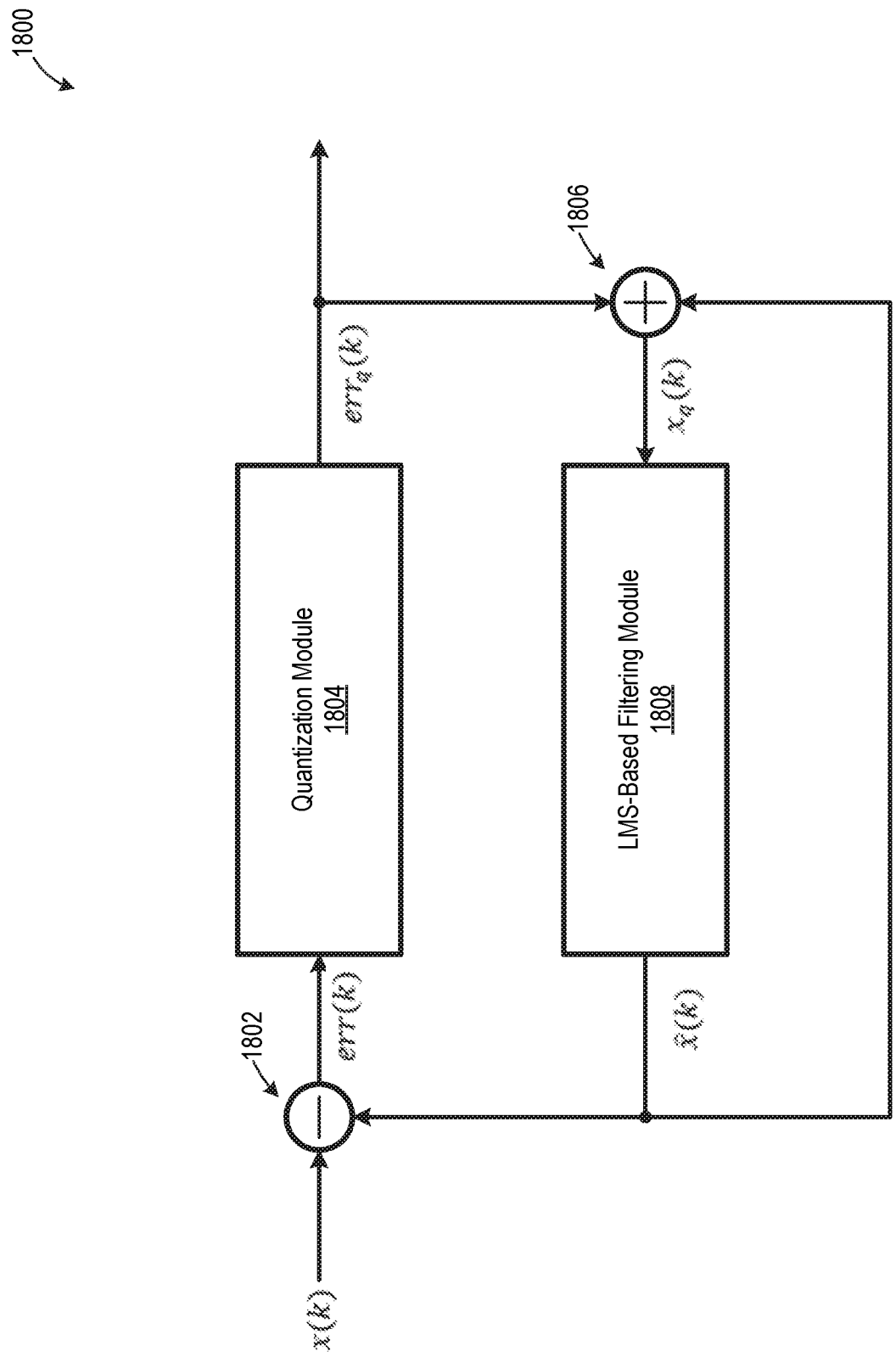
FIG. 18 is a block diagram of a data compression system using a least mean square-based filtering method, according to an embodiment.

FIG. 18 is a block diagram of a data compression system 1800, which is one embodiment of the new data compression systems using a LMS-based filtering method to generate a predicted signal for use with DPCM. Data compression system 1800 includes a subtraction module 1802, a quantization module 1804, an addition module 1806, and an LMS-based filtering module 1808. The modules of data compression system 1800 are implemented, for example, by digital electronics and/or by analog electronics. In some embodiments, at least some of the modules of data compression system 1800 are implemented by a processor executing computer-readable instructions.

Figure 19:
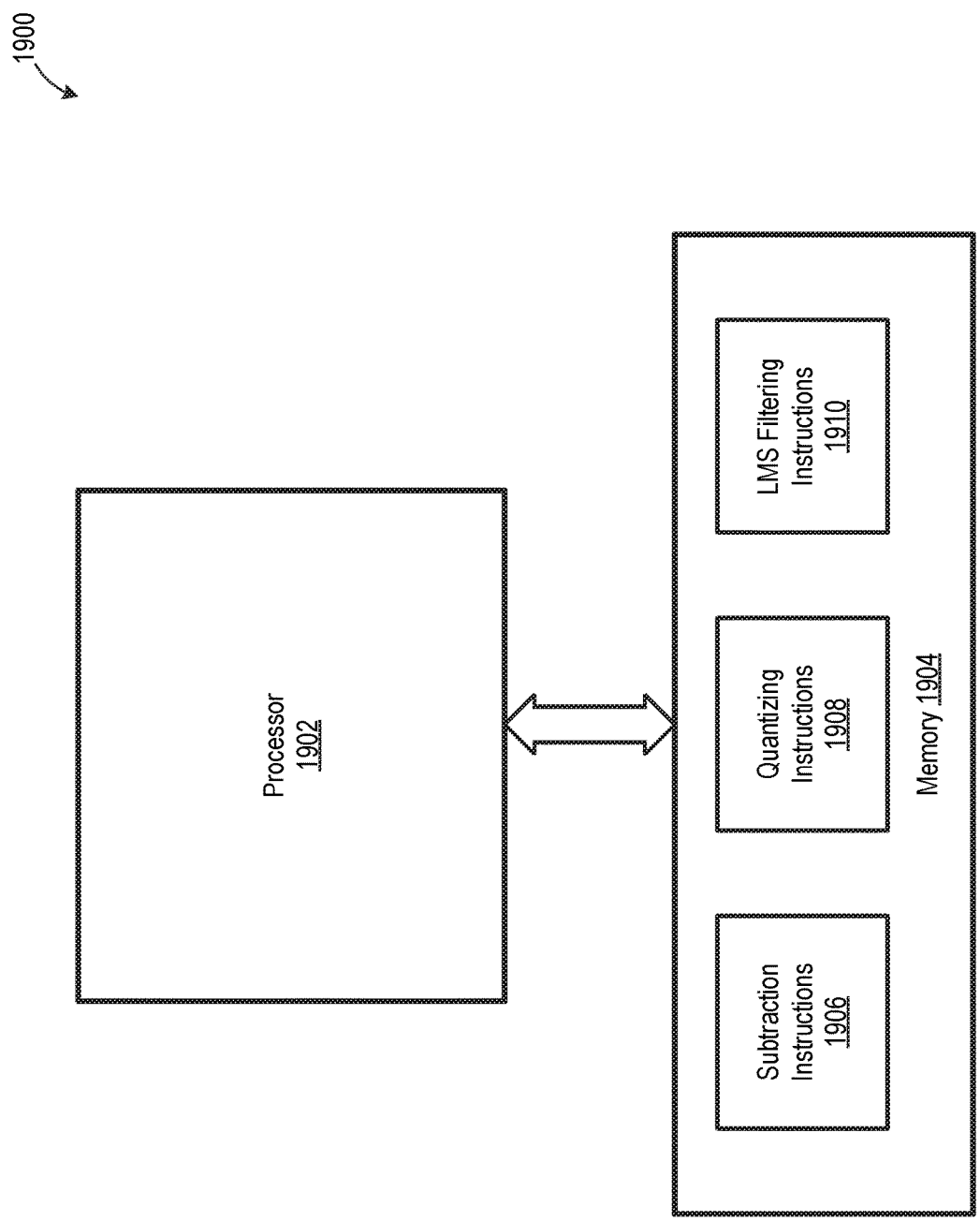
FIG. 19 is a block diagram illustrating one possible implementation of the FIG. 18 data compression system.

For example, FIG. 19 is a block diagram of a data compression system 1900, which is one possible implementation of data compression system 1800. Data compression system 1900 includes a processor 1902 and memory 1904. Processor 1902 is communicatively coupled to memory 1904, and processor 1902 executes computer-readable instructions stored in memory 1904 to perform at least some functions of data compression system 1800. For example, in certain embodiments, processor 1902 executes (a) subtraction instructions 1906 to implement subtraction module 1802, (b) quantizing instructions 1908 to execute quantization module 1804, and (c) LMS filtering instructions 1910 to execute LMS-based filtering module 1808. Instructions 1906, 1908, and 1910 are, for example, software and/or firmware. Processor 1902 may execute additional instructions (not shown) stored in memory 1904 without departing from the scope hereof.

Referring again to FIG. 18, although each of modules 1802, 1804, 1806, and 1808 are shown as discrete elements, in some embodiments, two or more of these elements are combined. Additionally, data compression system 1800 may be part of, and/or share elements with, another system. For example, in some embodiments, data compression system 1800 is implemented in a transmitter, such as discussed below with respect to FIG. 21.

Subtraction module 1802 subtracts a predicted signal $\hat{x}(k)$ from a sample $x(k)$ of an original signal (not shown in FIG. 18) to obtain an error signal err(k), where k is an index. The original signal represents, for example, data transmitted via a communication system. Quantization module 1804 quantizes error signal err(k) to obtain a quantized error signal $err_q(k)$. Quantized error signal $err_q(k)$ is used, for example, to modulate a carrier signal, such as discussed below with respect to FIG. 21. In some embodiments, quantization module 1804 generates quantized error signal $err_q(k)$ using a non-uniform quantizing algorithm, such as the relaxed Lloyd algorithm discussed above. However, quantization module 1804 may use a different algorithm, such as a μ-Law algorithm, an A-Law algorithm, or a K-Law algorithm, without departing from the scope hereof. Addition module 1806 adds quantized error signal $err_q(k)$ and predicted signal $\hat{x}(k)$ to obtain a quantized sample $x_q(k)$ of the original signal. LMS-based filtering module 1808 generates predicted signal $\hat{x}(k)$ from quantized sample $x_q(k)$ using a LMS-based filtering method. In some embodiments, LMS-based filtering module 1808 implements a finite impulse response (FIR) filter.

The LMS-based filtering method of LMS-based filtering module 1808 is characterized by generating the least mean square of an error signal, where the error signal is a difference between a desired signal and an actual signal. In some embodiments, LMS-based filtering module 1808 operates according to equations 4-6, as follows:

$$\hat{x}(k) = c(k) * v(k) \quad \text{(Eq. 4)}$$

$$err(k) = x(k) - \hat{x}(k) \quad \text{(Eq. 5)}$$

$$c(k+1) = c(k) + \mu \cdot err(k) \cdot conj[v(k)] \quad \text{(Eq. 6)}$$

In equations 4 and 6, v(k) is an original data vector defined as follows: $v(k)=[x(k-1), x(k-2), \ldots, x(k-N)]^T$. Thus, original data vector v(k) includes N sequential samples of the original signal. For example, x(k) is a current sample of the original signal, and x(k−1) is an immediately preceding sample of the original signal. N is an integer greater than or equal to one, and the value of N may be referred to as the "order" of LMS-based filtering module 1808. For example, if N is equal to three, LMS-based filtering module 1808 implements a third-order filter. c(k) in equations 4 and 6 is a tap-weight vector defined as follows: $c(k)=[c_1(k), c_2(k), \ldots, C_N(k)]$. μ in equation 6 is a step size, and conj[v(k)] in equation 6 is a complex conjugate of original data vector v(k).

In particular embodiments, data compression system 1800 executes equation 4 to generate predicted signal $\hat{x}(k)$, and data compression system 1800 executes equation 6 to update tap-weight vector c(k), i.e. to obtain updated tap-weight vector c(k+1) for sample k+1, where error signal err(k) is obtained from equation 5. Updating tap-weight vector c(k) advantageously enables LMS-based filtering module 1808 to adapt to real-time operating conditions of a communication system including data compression system 1800, which may be particularly beneficial if the communication system carries dynamic data, such as bursty data. Applicant has found that embodiments of LMS-based filtering module 1808 implementing Equations 4-6 will quickly converge to obtain a least mean square of error signal err(k) when initial tap-weights of tap-weight vector c(k) and step size μ are properly set. Additionally, it should be noted that equations 4-6 do not require calculating an inverse of a correlation matrix, which promotes computational efficiency of data compression system 1800, especially in high-order embodiments of LMS-based filtering module 1808.

Figure 20:
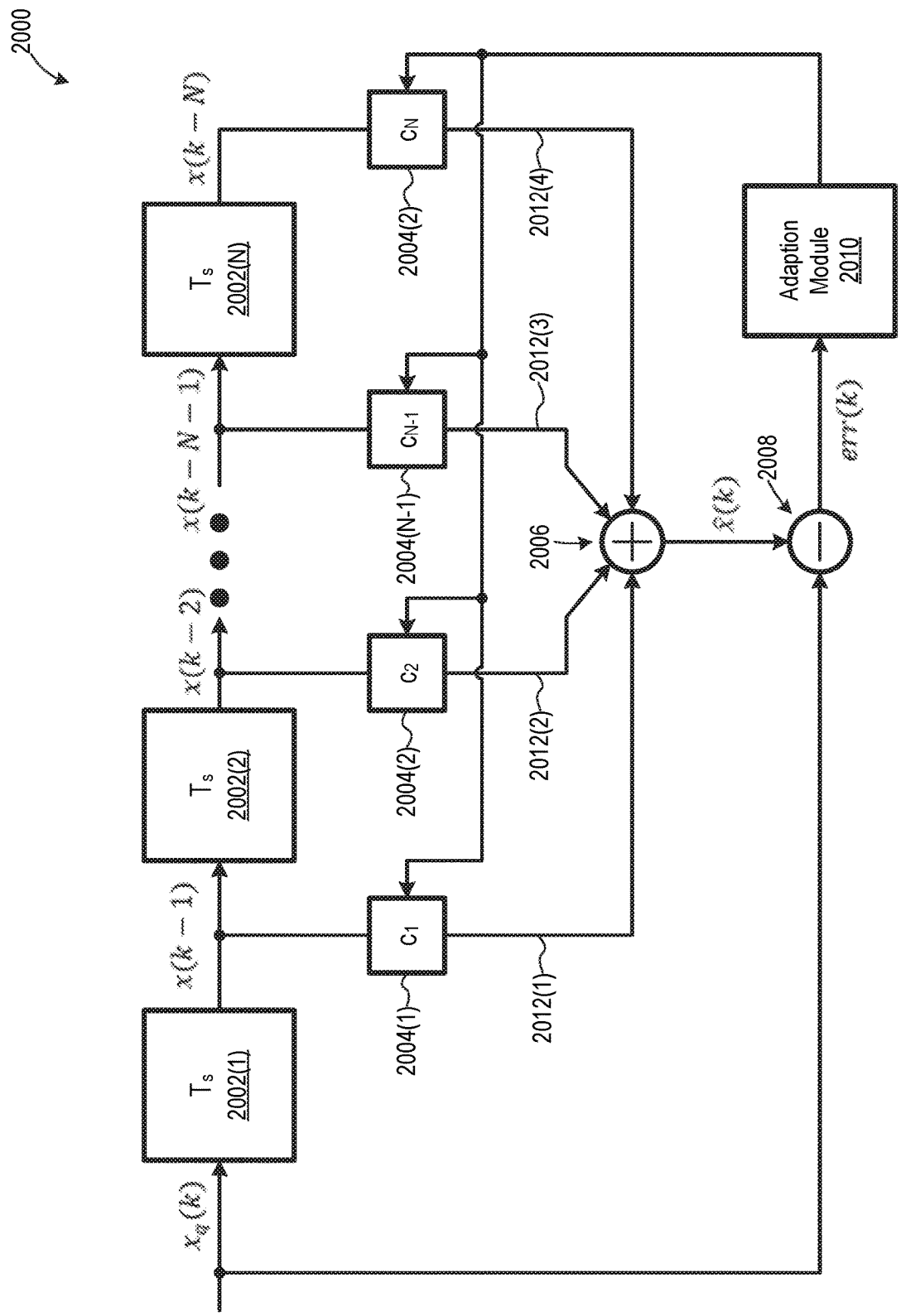
FIG. 20 is a block diagram of a least mean square-based filtering module, according to an embodiment.

FIG. 20 is a block diagram of a LMS-based filtering module 2000, which is one possible embodiment of LMS-based filtering module 1808 implementing equations 4-6. Filtering module 2000 includes N delay taps 2002, N tap-weight modules 2004, an addition module 2006, a subtraction module 2008, and an adaption module 2010. In this document, specific instances of an item may be referred to by use of a numeral in parentheses (e.g., delay tap 2002(1)) while numerals without parentheses refer to any such item (e.g., delay taps 2002). Each delay tap 2002 provides a respective sample of the original signal. For example, delay tap 2002(2) provides sample x(k−2) of the original signal, which is two samples preceding the current sample. Accordingly, delay taps 2002 collectively generate original data vector v(k).

Each tap weight module 2004 multiplies a respective sample of the original signal by a respective tap-weight of tap-weight vector c(k) to obtain a product 2012. For example, tap weight module 2004(2) multiples x(k−2) by $c_2(k)$ to obtain a product 2012(2), which is equal to x(k−2) $c_2(k)$. Addition module 2006 sums products 2012 to obtain predicted signal x̂(k), and subtraction module 2008 implements equation 5 to obtain err(k). Adaption module 2010 implements equation 6 to update tap-weight vector c(k) and provide respective updated tap-weights to tap weight modules 2004.

Referring again to FIG. 18, increasing order of LMS-based filtering module 1808, i.e. increasing N, generally increases SQNR of data compression system 1800. However, feedback loop gain margin decreases with increasing filter order, which may degrade stability. Additionally, increasing filter order increases complexity of LMS-based filtering module 1808. Applicant has determined that implementing LMS-based filtering module 1808 as a third-order filter or as a fourth-order filter may achieve a good tradeoff between high SQNR, stability, and minimal complexity.

Figure 21:
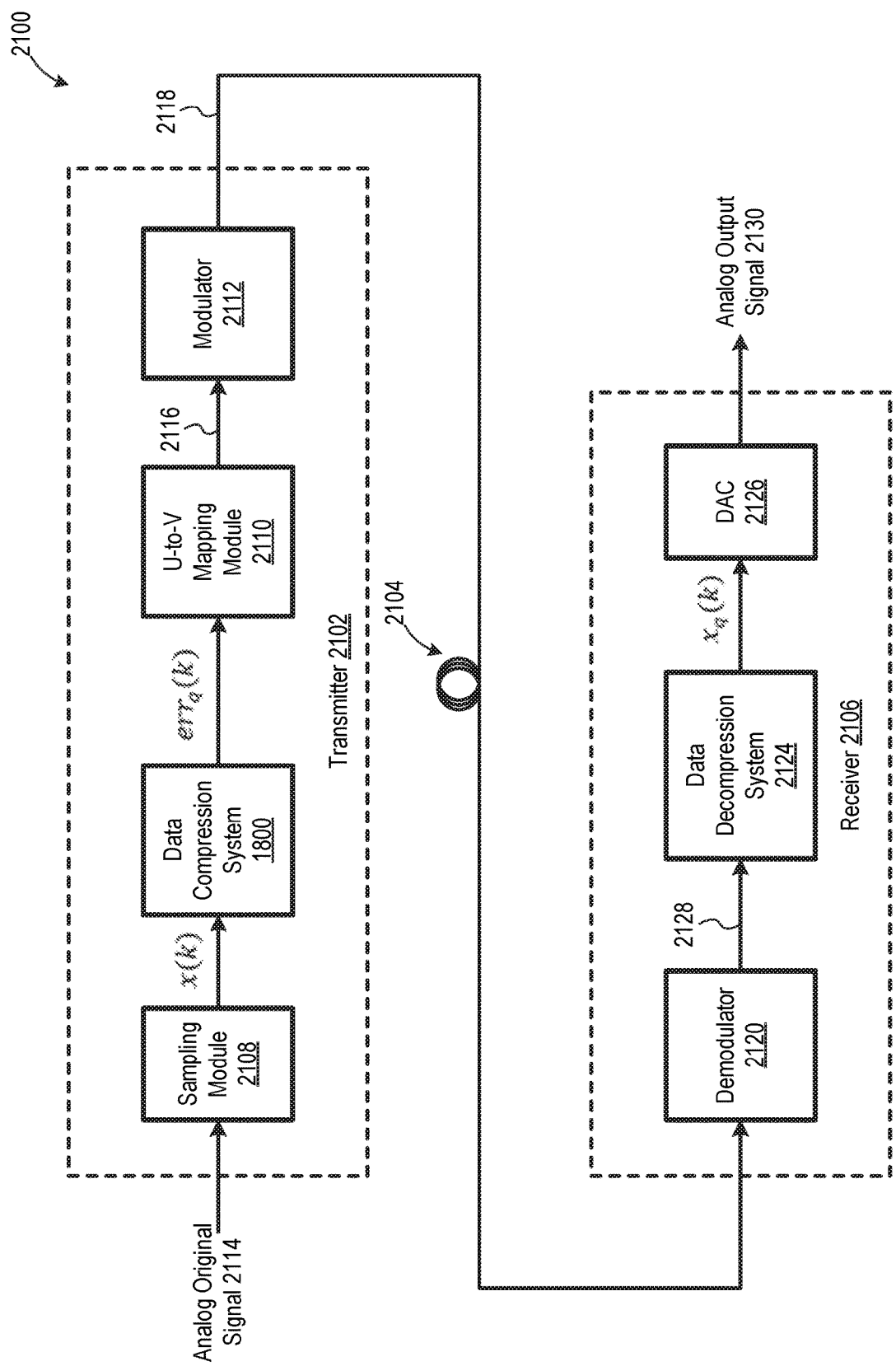
FIG. 21 is a block diagram of communication system including a transmitter with an instance of the FIG. 18 data compression system, according to an embodiment.

One possible application of data compression system 1800 is in a transmitter. For example, FIG. 21 is a block diagram of a communication system 2100 including a transmitter 2102, a communication medium 2104, and a receiver 2106. Transmitter 2012 includes a sampling module 2108, an instance of data compression system 1800, a mapping module 2110, and a modulator 2112. Transmitter 2102 and receiver 2106 are, for example, located at different respective locations. Sampling module 2108 is configured to sample an analog original signal 2114 to obtain sample x(k) of original signal 2114. In some embodiments, sampling module 2108 includes sample-and-hold electronic circuitry. Data compression system 1800 generates quantized error signal $err_q(k)$ from sample x(k), as discussed above with respect to FIG. 18. Mapping module 2110 is configured to map quantized error signal $err_q(k)$ from U bits to V bits to obtain a mapped error signal 2116, where (a) U and V are respective integers and (b) U is greater than V. In some embodiments, U is 15 and V is 8, for compatibility with a Common Public Radio Interface (CPRI). However, U and V could have other values without departing from the scope hereof. Modulator 2112 is configured to modulate a carrier signal according to mapped error signal 2116 to obtain a transmission signal 2118. Communication medium 2104 transmits transmission signal 2118 from a location of transmitter 2102 to a location of receiver 2106. Communication medium 2104 includes, for example, one or more of an electrical cable, an optical cable, and a wireless communication link. In some embodiments, communication medium 2104 is part of a 5G mobile fronthaul system.

Receiver 2106 includes a demodulator 2120, a data decompression system 2124, and a digital-to-analog converter (DAC) 2126. Demodulator 2120 demodulates transmission signal 2118 to obtain a demodulated signal 2128. Data decompression system 2124 maps demodulated signal 2128 from V bits to U bits to obtain quantized error signal $err_q(k)$, and data decompression system 2124 generates a quantized original signal $x_q(k)$ from quantized error signal $err_q(k)$. In some alternate embodiments, mapping of demodulated signal 2128 from V bits to U bits is performed outside of data decompression system 2124. DAC 2126 converts quantized original signal $x_q(k)$ into an analog output signal 2130. Analog output signal 2130 represents analog original signal 2114.

Figure 22:
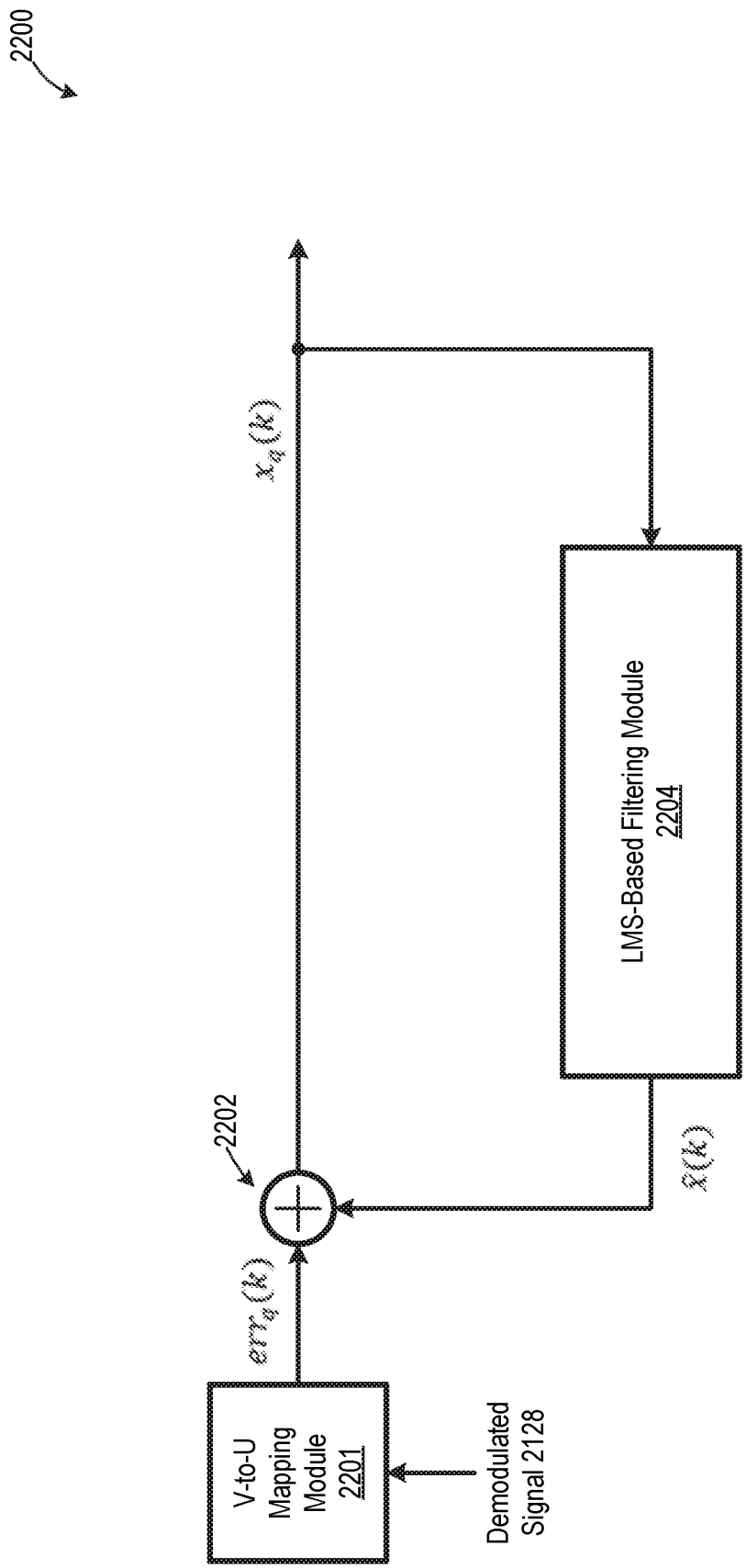
FIG. 22 is a block diagram of a data decompression system, according to an embodiment.

FIG. 22 is a block diagram of a data decompression system 2200, which is one possible embodiment of data decompression system 2124. Data decompression system 2200 includes a mapping module 2201, an addition module 2202, and an LMS-based filter 2204. The modules of data decompression system 2200 are implemented, for example, by digital electronics and/or by analog electronics. In some embodiments, at least some of the modules of data decompression system 2200 are implemented by a processor executing computer-readable instructions.

Figure 23:
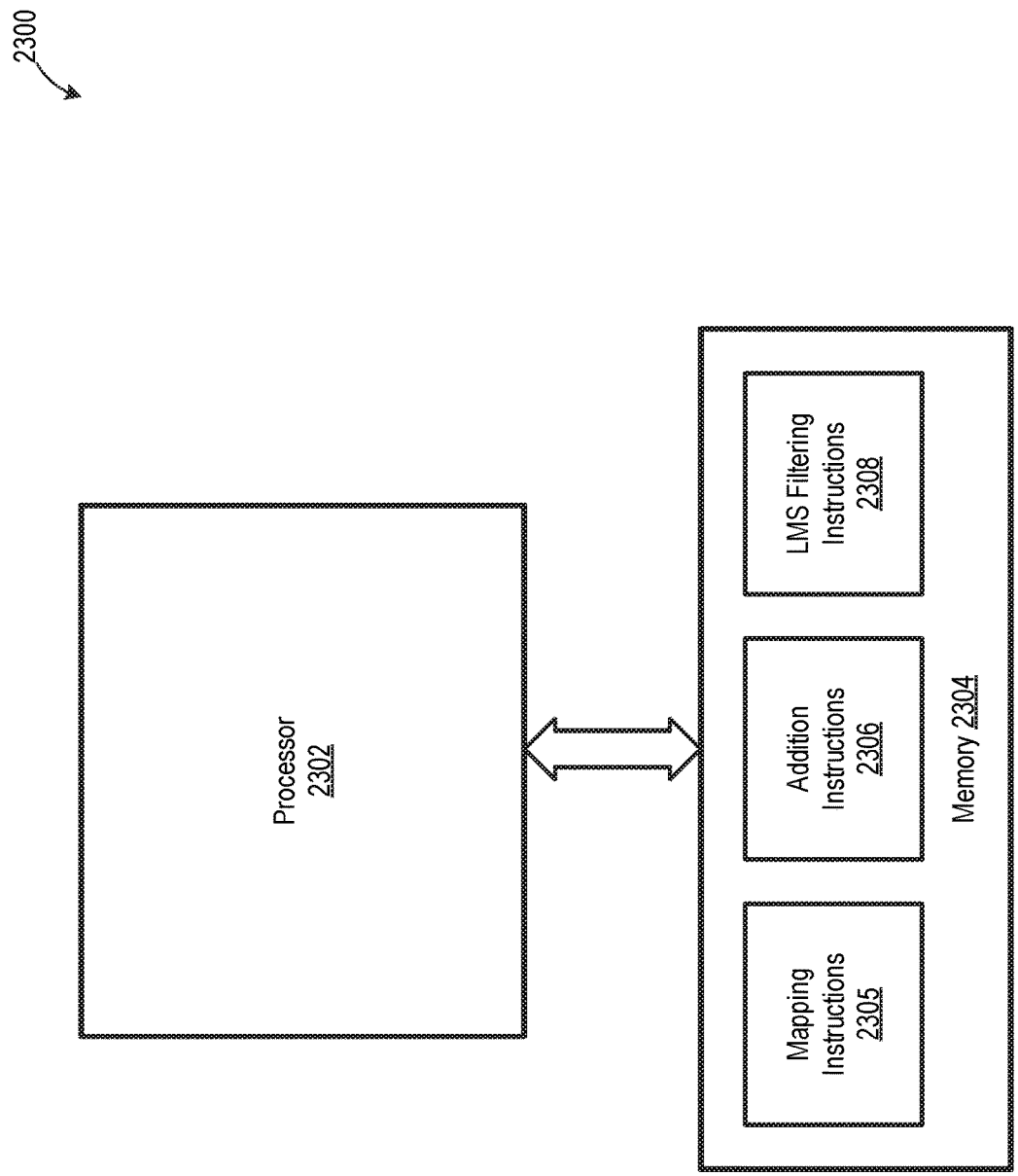
FIG. 23 is a block diagram illustrating one possible implementation of the FIG. 22 data decompression system.

For example, FIG. 23 is a block diagram of a data decompression system 2300, which is one possible implementation of data decompression system 2200. Data compression system 2300 includes a processor 2302 and memory 2304. Processor 2302 is communicatively coupled to memory 2304, and processor 2302 executes computer-readable instructions stored in memory 2304 to perform at least some functions of data decompression system 2200. For example, in certain embodiments, processor 2302 executes (a) mapping instructions 2305 to implement mapping module 2201, (b) addition instructions 2306 to implement addition module 2202, and (c) LMS filtering instructions 2308 to execute LMS-based filtering module 2204. Instructions 2305, 2306, and 2308 are, for example, software and/or firmware. Processor 2302 may execute additional instructions (not shown) stored in memory 2304 without departing from the scope hereof.

Referring again to FIG. 22, although each of modules 2201, 2202, and 2204 are shown as discrete elements, in some embodiments, two or more of these elements are combined. Additionally, data decompression system 2200 may be part of, and/or share elements with, another system. For example, in some embodiments, data compression system 2200 is implemented in a receiver, such as discussed above with respect to FIG. 21.

Mapping module 2201 maps demodulated signal 2128 from V bits to U bits to obtain quantized error signal $err_q(k)$. Addition module 2202 adds a predicted signal x̂(k) from LMS-based filter 2204 to quantized error signal $err_q(k)$ to obtain quantized original signal $x_q(k)$. In some embodiments, LMS-based filtering module 2204 is implemented in the same manner as, or in a similar manner to, LMS-based filtering module 1808, e.g. as illustrated in FIG. 20.

Figure 24:
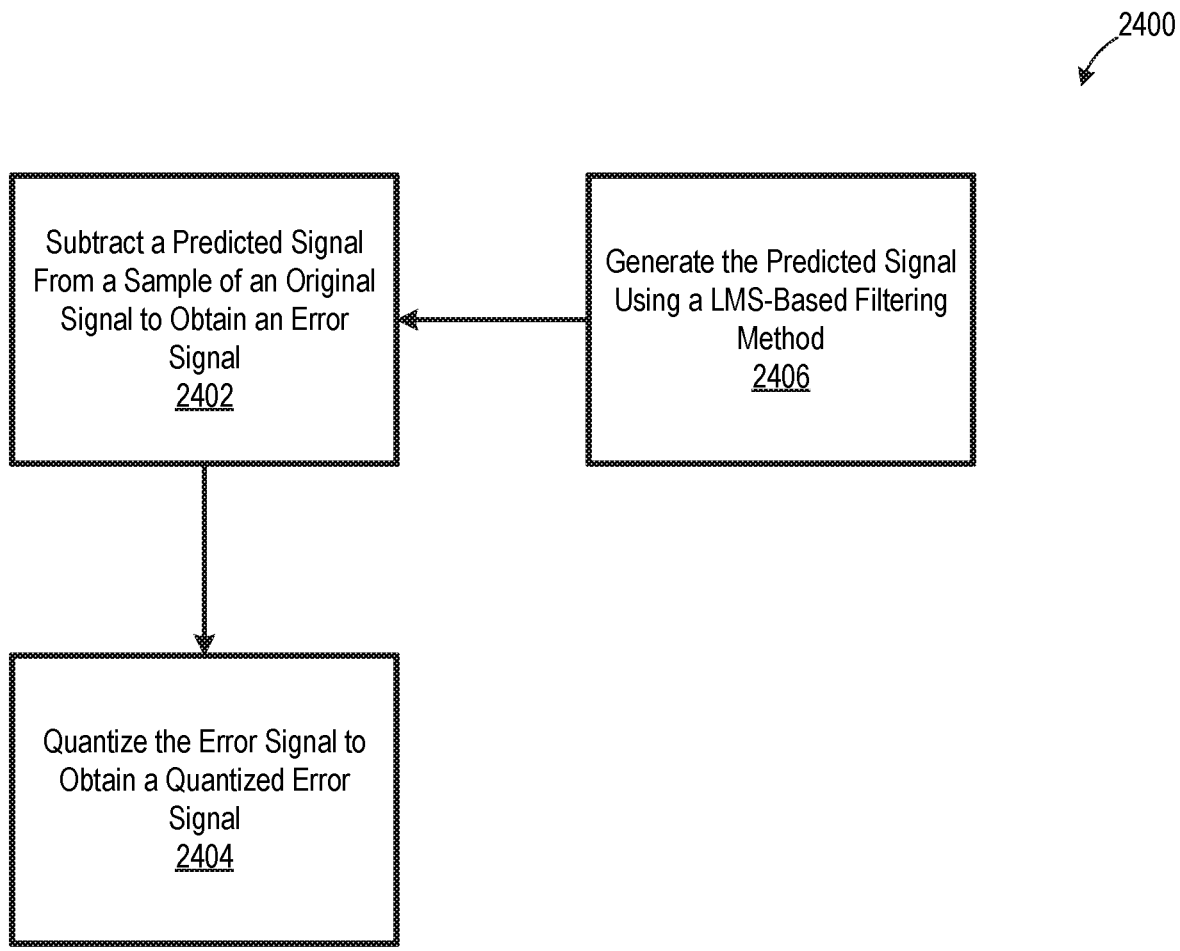
FIG. 24 is a block diagram illustrating a method for differentiator-based compression of digital data, according to an embodiment.

FIG. 24 is a block diagram illustrating a method for differentiator-based compression of digital data. In a block 2402, a predicted signal is subtracted from a sample of an original signal to obtain an error signal. In one example of block 2402, subtraction module 1802 subtracts predicted signal x̂(k) from sample x(k) to obtain error signal err(k) (FIG. 18). In a block 2404, the error signal is quantized to obtain a quantized error signal. In one example of block 2404, quantization module 1804 quantizes error signal err(k) to obtain quantized error signal $err_q(k)$. In a block 2406, the predicted signal is generated using a LMS-based filtering method. In one example of block 2406, LMS-based filtering module 1808 generates predicted signal x̂(k) from quantized sample $x_q(k)$ using a LMS-based filtering method.

Figure 25:
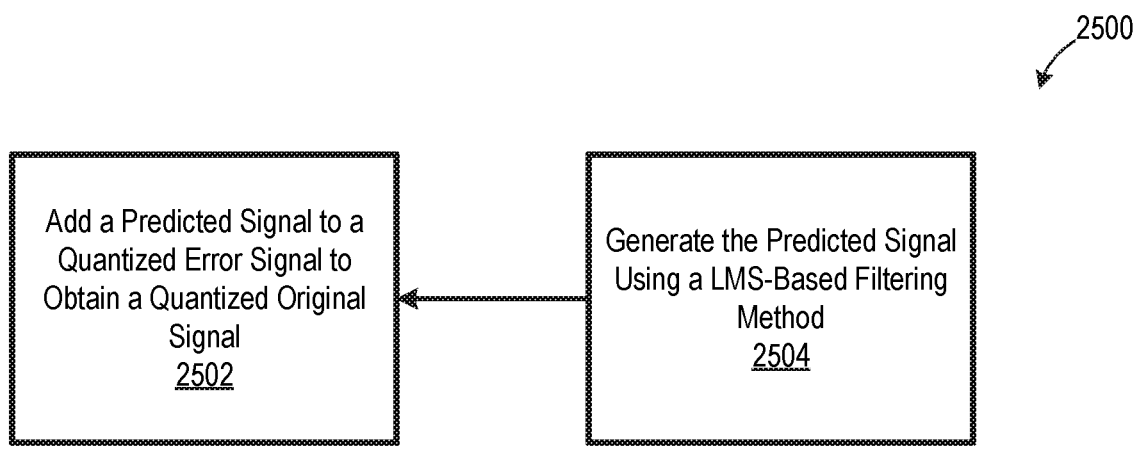
FIG. 25 is a block diagram illustrating a method for differentiator-based decompression, according to an embodiment.

FIG. 25 is a block diagram illustrating a method for differentiator-based decompression. In a block 2502, a predicted signal is added to a quantized error signal to obtain a quantized original signal. In one example of block 2502, addition module 2202 adds predicted signal x̂(k) from LMS-based filter 2204 to quantized error signal $err_q(k)$ to obtain quantized original signal $x_q(k)$ (FIG. 22). In a block 2504, the predicted signal is generated using a LMS-based filtering method. In one example of block 2504, LMS-based filtering module 2204 generates predicted signal x̂(k) from quantized original signal $x_q(k)$.

Figure 26:
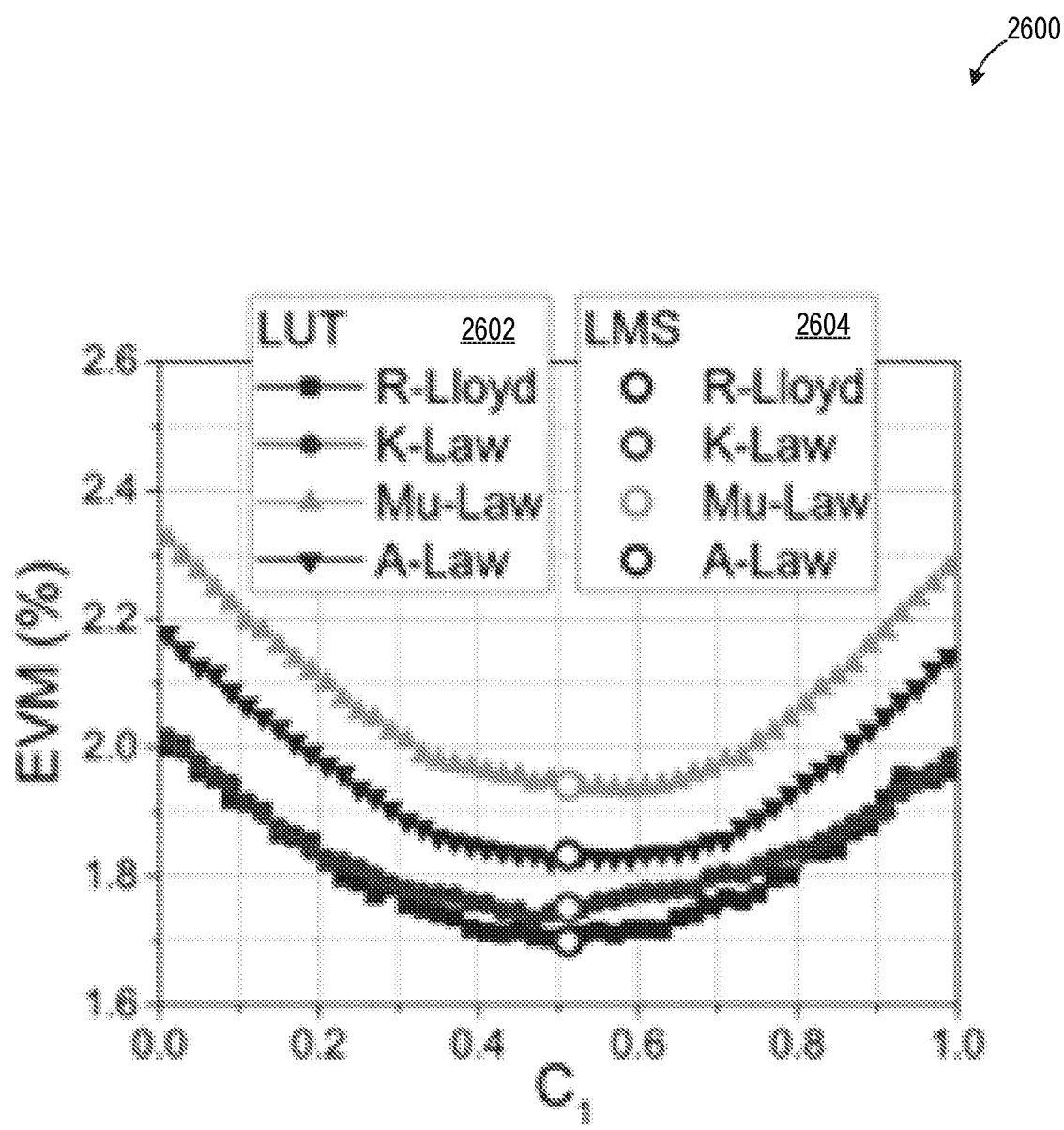
FIG. 26 is a graph of simulated error-vector-magnitude verses value of tap-weight, for several data compression systems.

Applicant has conducted simulations to evaluate performance of certain embodiments of data compression system 1800. For example, FIG. 26 is a graph 2600 of simulated EVM verses value of tap-weight $C_1$. Data points 2602 correspond to a single-order differentiator-based data compression system where an optimum tap-weight is determined by consulting a lookup table (LUT). Data points 2604 correspond to a single-order embodiment of data compression system 1800, i.e. N=1, implementing equations 4-6. Both data points 2602 and data points 2604 include data points for several quantizing algorithms, i.e. a R-Lloyd algorithm, a μ-Law algorithm (also referred to a Mu-Law Algorithm), an A-Law algorithm, and a K-Law algorithm. As evident from FIG. 26, these embodiments of data compression system 1800 achieved an essentially optimum value of tap-weight $C_1$, i.e. a tap-weight value that resulted in a smallest EVM, by updating tap-weight $C_1$ using equation 6. Additionally, both data points 2602 and 2604 show that the R-Lloyd algorithm achieved significantly smaller EVM that the μ-Law and A-Law algorithms. Additionally, the R-Lloyd algorithm achieved equivalent or slightly smaller EVM than the K-Law algorithm, depending on the value of tap-weight $C_1$.

Figure 27:
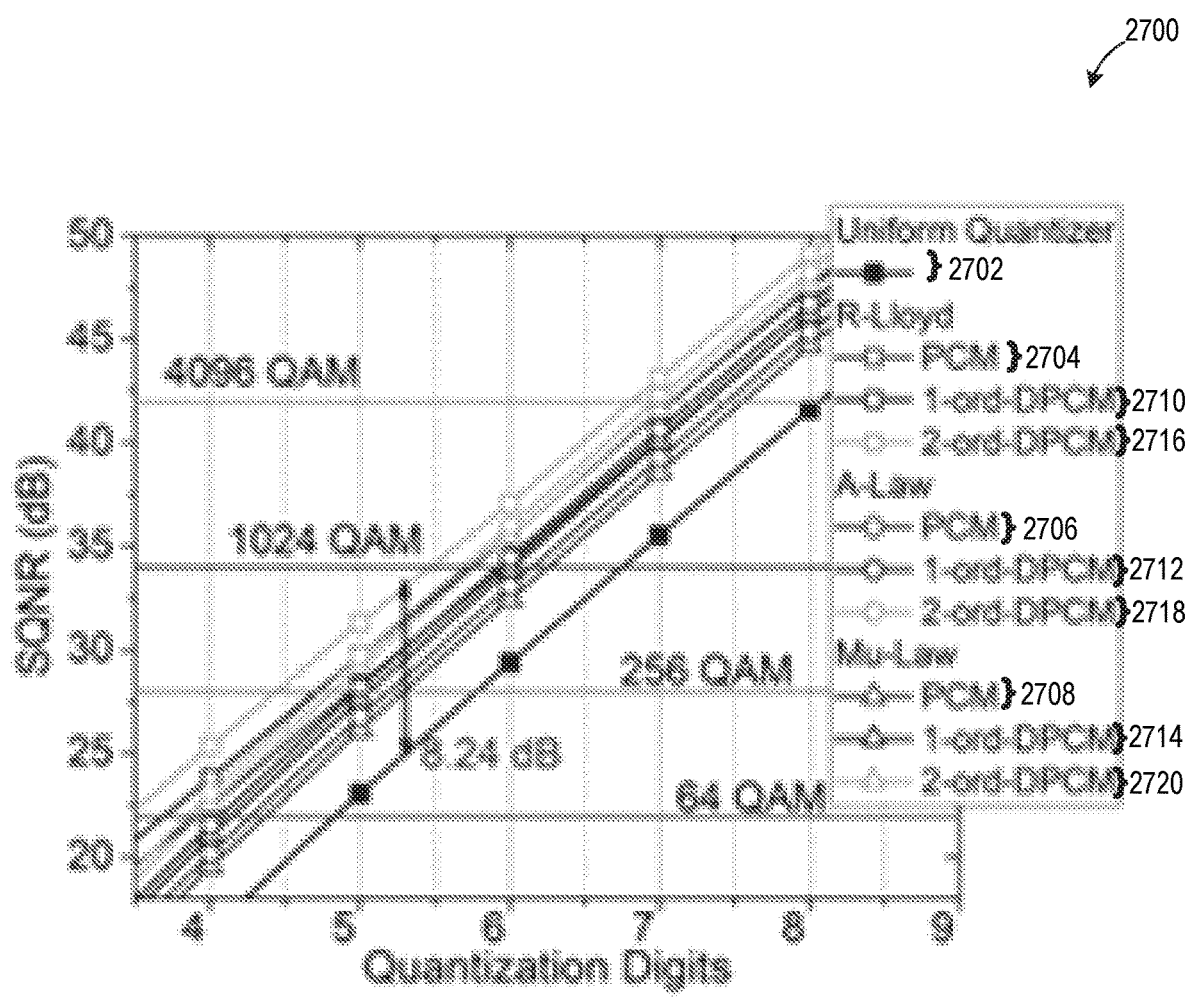
FIG. 27 is a graph of simulated signal-to-quantization-noise ratio verses number of quantization digits, for several data compression systems.

FIG. 27 is a graph 2700 of simulated SQNR verses number of quantization digits for several embodiments of data compression system 1800, as well for several embodiments of conventional data compression systems. SQNR thresholds for 64-QAM, 256-QAM, 1024-QAM, and 4096-QAM are also shown in FIG. 27. Data points 2702 correspond to a conventional data compression system including a uniform optimizer. Data points 2704, 2706, and 2708 correspond to a conventional data compression system implementing PCM and using R-Lloyd, A-Law, and μ-Law algorithms, respectively. Data points 2710, 2712, and 2714 correspond to embodiments of data compression system 1800 where N=1 and quantizing module 1804 uses an R-Lloyd algorithm, an A-Law algorithm, and a μ-Law algorithm, respectively. Data points 2716, 2718, and 2720 correspond to embodiments of data compression system 1800 where N=2 and quantizing module 1804 uses an R-Lloyd algorithm, an A-Law algorithm, and a μ-Law algorithm, respectively.

It can be determined from graph 2700 that there is around 6-dB improvement in SQNR by adding one more quantization digit. Compared with PCM, first-order and second-order DPCM can bring about an extra 1.4-dB and 1.24-dB improvement, respectively. By combining second-order DPCM and an R-Lloyd quantization algorithm, an 8.24-dB improvement can be achieved in SQNR. Considering that nearly a 6-dB SQNR improvement can be traded for one quantization digit reduction, it is evident that data compression system 1800 can improve quantization efficiency relative to conventional data compression systems.

Exemplary embodiments of systems and methods for non-uniform quantizers and data compression are described above in detail. The systems and methods of this disclosure though, are not limited to only the specific embodiments described herein, but rather, the components and/or steps of their implementation may be utilized independently and separately from other components and/or steps described herein.

Although specific features of various embodiments of the disclosure may be shown in some drawings and not in others, this is for convenience only. In accordance with the principles of the disclosure, a particular feature shown in a drawing may be referenced and/or claimed in combination with features of the other drawings.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a DSP device, and/or any other circuit or processor capable of executing the functions described herein. The processes described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term "processor."

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for differentiator-based compression of digital data, comprising:
   generating a predicted signal using an adaptive filtering method, wherein generating the predicted signal using the adaptive filtering method comprises multiplying a tap-weight vector by an original data vector to generate the predicted signal, the original data vector comprising N sequential samples of an original signal, N being an integer greater than or equal to one;
   using a subtraction module, subtracting the predicted signal from a sample of the original signal to obtain an error signal;
   using a non-uniform quantizer, quantizing the error signal to obtain a quantized error signal; and
   updating the tap-weight vector by adding to the tap-weight vector a product of (a) a step size, (b) the error signal, and (c) a complex conjugate of the original data vector.

2. The method of claim 1, wherein N is an integer greater than one.

3. The method of claim 1, wherein quantizing the error signal to obtain the quantized error signal comprises using a non-uniform quantizing algorithm to quantize the error signal.

4. The method of claim 3, wherein the non-uniform quantizing algorithm comprises a relaxed Lloyd algorithm.

5. The method of claim 1, wherein the steps of generating, subtracting, and quantizing are performed by a processor executing computer-readable instructions stored in a memory.

6. A method for generating a signal for transmission over a transmission medium, comprising:
   sampling an analog original signal to obtain a sample of the original signal;
   using the method of claim 1, obtaining a quantized error signal from the sample of the original signal;
   mapping the quantized error signal from U bits to V bits to obtain a mapped error signal, U and V each being respective integers, and U being greater than V; and
   modulating a carrier signal according to the mapped error signal to obtain the signal for transmission over the transmission medium.

7. A method for receiving a signal, comprising:
receiving a transmission signal from a transmission medium;
demodulating the transmission signal to obtain a demodulated signal;
mapping the demodulated signal from V to U bits to obtain a quantized error signal, U and V each being respective integers, and U being greater than V;
decompressing the quantized error signal to obtain a quantized original signal by:
generating a predicted signal using an adaptive filtering method, and
using an addition module, adding the predicted signal to a quantized error signal to obtain the quantized original signal; and
converting the quantized original signal into an analog output signal.

8. The method of claim 7, wherein generating the predicted signal using the adaptive filtering method comprises multiplying a tap-weight vector by an original data vector to generate the predicted signal, the original data vector comprising N sequential samples of the original signal, N being an integer greater than or equal to one.

9. The method of claim 8, wherein N is an integer greater than one.

10. The method of claim 7, wherein the steps of adding and generating are performed by a processor executing computer-readable instructions stored in a memory.

11. A method for transmitting data, comprising:
sampling an analog original signal to obtain a sample of the original signal;
generating a first predicted signal using a first least means square (LMS)-based filtering method;
subtracting the first predicted signal from the sample of the original signal to obtain an error signal;
quantizing the error signal to obtain a quantized error signal;
mapping the quantized error signal from U bits to V bits to obtain a mapped error signal, U and V each being respective integers, and U being greater than V;
modulating a carrier signal according to mapped error signal to obtain a transmission signal;
transmitting the transmission signal from a first location to a second location using a transmission medium;
demodulating the transmission signal to obtain a demodulated signal;
mapping the demodulated signal from V to U bits to obtain the quantized error signal;
generating a second predicted signal using a second LMS-based filtering method;
using an addition module, adding the second predicted signal to the quantized error signal to obtain a quantized original signal; and
converting the quantized original signal into an analog output signal.

12. The method of claim 11, wherein generating the first predicted signal using the first LMS-based filtering method comprises multiplying a tap-weight vector by an original data vector to generate the first predicted signal, the original data vector comprising N sequential values of the original signal, N being an integer greater than or equal to one.

13. The method of claim 12, further comprising updating the tap-weight vector by adding to the tap-weight vector a product of (a) a step size, (b) the error signal, and (c) a complex conjugate of the original data vector.

14. The method of claim 13, wherein N is an integer greater than one.

15. The method of claim 11, wherein quantizing the error signal to obtain a quantized error signal comprises using a non-uniform quantizing algorithm to quantize the error signal.

16. The method of claim 15, wherein the non-uniform quantizing algorithm comprises a relaxed Lloyd algorithm.

17. The method of claim 11, wherein:
the step of modulating is performed by a transmitting device; and
the step of demodulating is performed by a receiving device.

* * * * *